(12) United States Patent
Ware et al.

(10) Patent No.: US 10,504,583 B2
(45) Date of Patent: Dec. 10, 2019

(54) MEMORY SYSTEMS AND METHODS FOR IMPROVED POWER MANAGEMENT

(71) Applicant: Rambus Inc., Sunnyvale, CA (US)

(72) Inventors: Frederick A. Ware, Los Altos Hills, CA (US); James E. Harris, Tyler, TX (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 16/101,480

(22) Filed: Aug. 12, 2018

(65) Prior Publication Data

US 2019/0115065 A1 Apr. 18, 2019

Related U.S. Application Data

(63) Continuation of application No. 15/522,182, filed as application No. PCT/US2015/058956 on Nov. 4, 2015, now Pat. No. 10,074,417.

(60) Provisional application No. 62/082,294, filed on Nov. 20, 2014.

(51) Int. Cl.
*G11C 7/22* (2006.01)
*G11C 11/4093* (2006.01)
*G11C 5/04* (2006.01)
*G11C 5/06* (2006.01)
*G11C 8/12* (2006.01)

(52) U.S. Cl.
CPC ............ *G11C 11/4093* (2013.01); *G11C 5/04* (2013.01); *G11C 5/063* (2013.01); *G11C 7/22* (2013.01); *G11C 8/12* (2013.01)

(58) Field of Classification Search
CPC .................................. G11C 7/222; G11C 7/22

USPC ............................................ 365/189.05, 194
See application file for complete search history.

(56) References Cited

U.S. PATENT DOCUMENTS

| 5,881,017 A * | 3/1999 | Matsumoto .......... G11C 7/1021 365/230.04 |
| 5,892,730 A * | 4/1999 | Sato ..................... G11C 7/1072 365/189.05 |
| 6,058,063 A | 5/2000 | Jang |
| 6,161,162 A | 12/2000 | DeRoo et al. |
| 6,172,893 B1 * | 1/2001 | Ryan .................. G06F 12/0893 365/230.01 |
| 6,240,048 B1 | 5/2001 | Matsubara |

(Continued)

OTHER PUBLICATIONS

Notification Concerning Transmittal of International Preliminary Report on Patentability dated Jun. 1, 2017 re: Int'l Appln. No. PCT/US2015/058956. 7 Pages.

*Primary Examiner* — Michael T Tran
(74) *Attorney, Agent, or Firm* — Silicon Edge Law Group LLP; Arthur J. Behiel

(57) ABSTRACT

A memory module with multiple memory devices includes a buffer system that manages communication between a memory controller and the memory devices. Each memory device supports an access mode and a low-power mode, the latter used to save power for devices that are not immediately needed. The module provides granular power management using a chip-select decoder that decodes chip-select signals from the memory controller into power-state signals that determine which of the memory devices are in which of the modes. Devices can thus be brought out of the low-power mode in relatively small numbers, as needed, to limit power consumption.

20 Claims, 17 Drawing Sheets

(56) References Cited

U.S. PATENT DOCUMENTS

| | | | |
|---|---|---|---|
| 6,295,560 B1* | 9/2001 | Kanno | G06F 9/5083 370/432 |
| 6,337,814 B1 | 1/2002 | Tanida et al. | |
| 6,351,404 B1 | 2/2002 | Wright et al. | |
| 6,742,098 B1* | 5/2004 | Halbert | G06F 13/4256 365/230.05 |
| 6,941,433 B1* | 9/2005 | Libby | G06F 13/4239 365/191 |
| 7,773,435 B2* | 8/2010 | Cho | G11C 7/1051 365/194 |
| 7,796,694 B1 | 9/2010 | O'Connor et al. | |
| 7,889,595 B2* | 2/2011 | Park | G11C 7/1072 365/230.06 |
| 7,994,833 B2* | 8/2011 | Shin | H03L 7/0814 327/149 |
| 8,030,981 B2* | 10/2011 | Kim | G11C 7/1045 327/161 |
| 8,144,530 B2* | 3/2012 | Kim | G11C 7/1066 327/158 |
| 8,539,145 B1 | 9/2013 | Warnes et al. | |
| 8,667,312 B2 | 3/2014 | Rajan et al. | |
| 8,984,320 B2* | 3/2015 | Bringivijayaraghavan | G11C 7/109 365/189.05 |
| 9,166,579 B2* | 10/2015 | Huber | G11C 7/04 |
| 9,443,565 B2* | 9/2016 | Jung | G11C 7/02 |
| 9,508,417 B2* | 11/2016 | Kwak | G11C 11/4076 |
| 9,778,877 B1 | 10/2017 | Ware | |
| 9,843,315 B2* | 12/2017 | Ware | G11C 7/1066 |
| 2002/0184461 A1* | 12/2002 | Zumkehr | G06F 13/4239 711/167 |
| 2003/0067812 A1 | 4/2003 | Kajimoto | |
| 2003/0105932 A1 | 6/2003 | David et al. | |
| 2004/0107324 A1 | 6/2004 | Nystuen | |
| 2005/0078019 A1 | 4/2005 | Cohen et al. | |
| 2005/0117376 A1* | 6/2005 | Wilson | G06F 1/263 363/142 |
| 2006/0039204 A1 | 2/2006 | Cornelius | |
| 2006/0039205 A1 | 2/2006 | Cornelius | |
| 2006/0112293 A1 | 5/2006 | Przybysz et al. | |
| 2006/0161745 A1 | 7/2006 | Lee et al. | |
| 2007/0025487 A1 | 2/2007 | Chiba | |
| 2007/0047340 A1* | 3/2007 | Kim | G11C 7/1072 365/194 |
| 2007/0237010 A1* | 10/2007 | Hong | G06F 13/1684 365/193 |
| 2008/0024165 A1 | 1/2008 | Madurawe et al. | |
| 2008/0031072 A1 | 2/2008 | Rajan et al. | |
| 2008/0080261 A1 | 4/2008 | Shaeffer et al. | |
| 2008/0192563 A1* | 8/2008 | Cho | G11C 7/22 365/233.17 |
| 2009/0040847 A1* | 2/2009 | Lee | G11C 7/1051 365/194 |
| 2009/0184805 A1* | 7/2009 | Yamada | H04Q 9/00 340/10.51 |
| 2009/0216939 A1 | 8/2009 | Smith et al. | |
| 2010/0036997 A1 | 2/2010 | Brewer et al. | |
| 2010/0091537 A1* | 4/2010 | Best | G11C 5/02 365/51 |
| 2010/0124130 A1* | 5/2010 | Oh | G11C 7/1051 365/193 |
| 2011/0016279 A1 | 1/2011 | Gillingham | |
| 2011/0078549 A1* | 3/2011 | Thueringer | H04L 9/3271 714/807 |
| 2012/0063246 A1* | 3/2012 | Suzuki | G11C 7/1066 365/193 |
| 2012/0140869 A1* | 6/2012 | Choi | H03K 5/131 377/2 |
| 2012/0257459 A1 | 10/2012 | Berke | |
| 2013/0031326 A1* | 1/2013 | Grunzke | G11C 5/04 711/167 |
| 2013/0058175 A1 | 3/2013 | Lin et al. | |
| 2013/0086334 A1 | 4/2013 | Schuetz | |
| 2013/0162874 A1* | 6/2013 | Hashimoto | H04N 5/243 348/300 |
| 2013/0194881 A1* | 8/2013 | Woo | G11C 7/00 365/191 |
| 2013/0214833 A1* | 8/2013 | Kim | G11C 7/1066 327/156 |
| 2013/0246831 A1 | 9/2013 | Yuzawa | |
| 2013/0254495 A1 | 9/2013 | Kim et al. | |
| 2013/0293310 A1 | 11/2013 | Levesque et al. | |
| 2013/0307616 A1 | 11/2013 | Berchtold et al. | |
| 2014/0082453 A1* | 3/2014 | Sikdar | G11C 29/808 714/763 |
| 2014/0112401 A1 | 4/2014 | Wiley et al. | |
| 2014/0119148 A1* | 5/2014 | Earle | G11C 8/16 365/230.02 |
| 2016/0011813 A1* | 1/2016 | Ellis | G06F 11/1048 714/763 |
| 2016/0098328 A1* | 4/2016 | Lucas | G06F 1/26 714/14 |
| 2016/0306591 A1* | 10/2016 | Ellis | G06F 3/0653 |

* cited by examiner

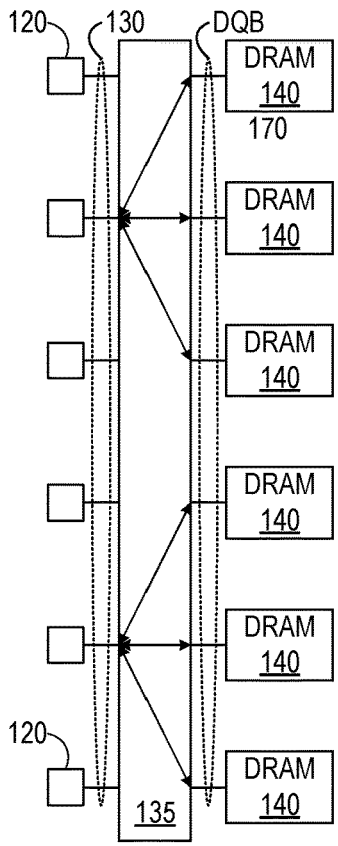
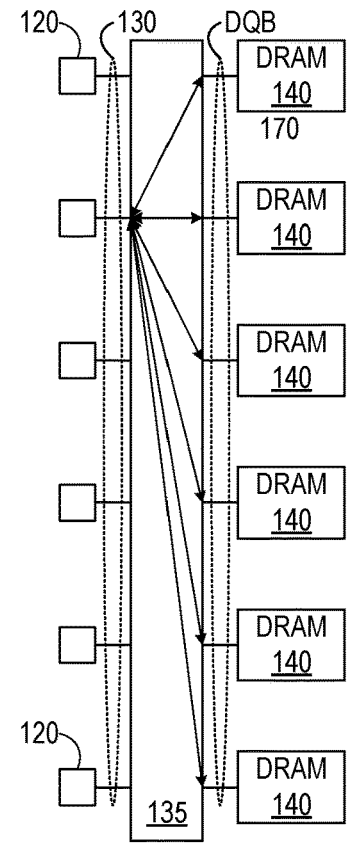
Fig. 1C
Fig. 1D
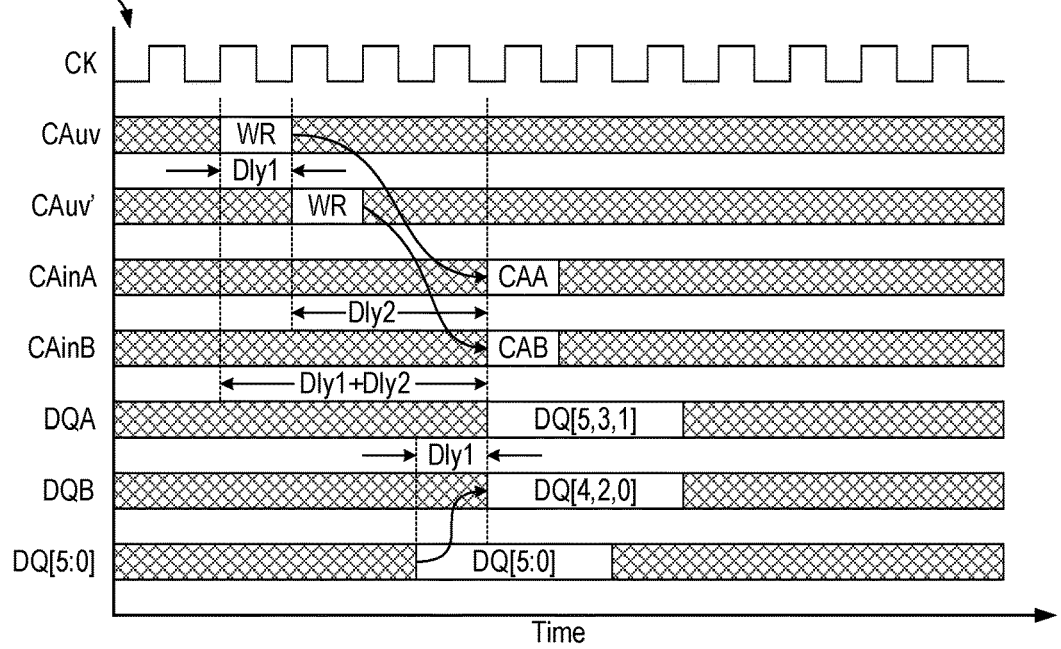
Fig. 2

US 10,504,583 B2

MEMORY SYSTEMS AND METHODS FOR IMPROVED POWER MANAGEMENT

FIELD OF THE INVENTION

This invention relates to computer memory systems, and more particularly to modular memory systems.

BACKGROUND

Computer memory systems commonly include a memory controller connected to one or more memory modules via a memory channel or channels. In this context, a "memory module" is a printed-circuit board that supports and interconnects dynamic, random-access memory (DRAM) devices. Computer vendors can offer different amounts of memory by installing more or fewer memory modules, and computer users can upgrade their computers by installing different or additional modules for improved capacity or performance.

Lithographic feature size has shrunk for each generation of DRAM devices. As a result, memory systems have steadily improved in both storage capacity and signaling rates. Unfortunately, one metric of memory-system design that has not shown comparable improvement is the module capacity of a standard memory channel. That is, the number of memory modules that may be connected to a given memory channel has not grown with module capacity and speed performance.

A key reason why module capacity has not grown with other performance metrics is that each module attached to a given channel tends to degrade signals on the channel, necessitating an undesirable reduction in signal rates and concomitant reduction in speed performance. For this reason, modern memory systems are commonly limited to just one or two modules per channel when operating at the maximum signaling rate.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 1C and 1D depict additional configurations of data buffer 135.

FIG. 2 is a waveform diagram 200 illustrating a write transaction for the two-module memory system 100B of FIG. 1B.

DETAILED DESCRIPTION

Figure 1A:
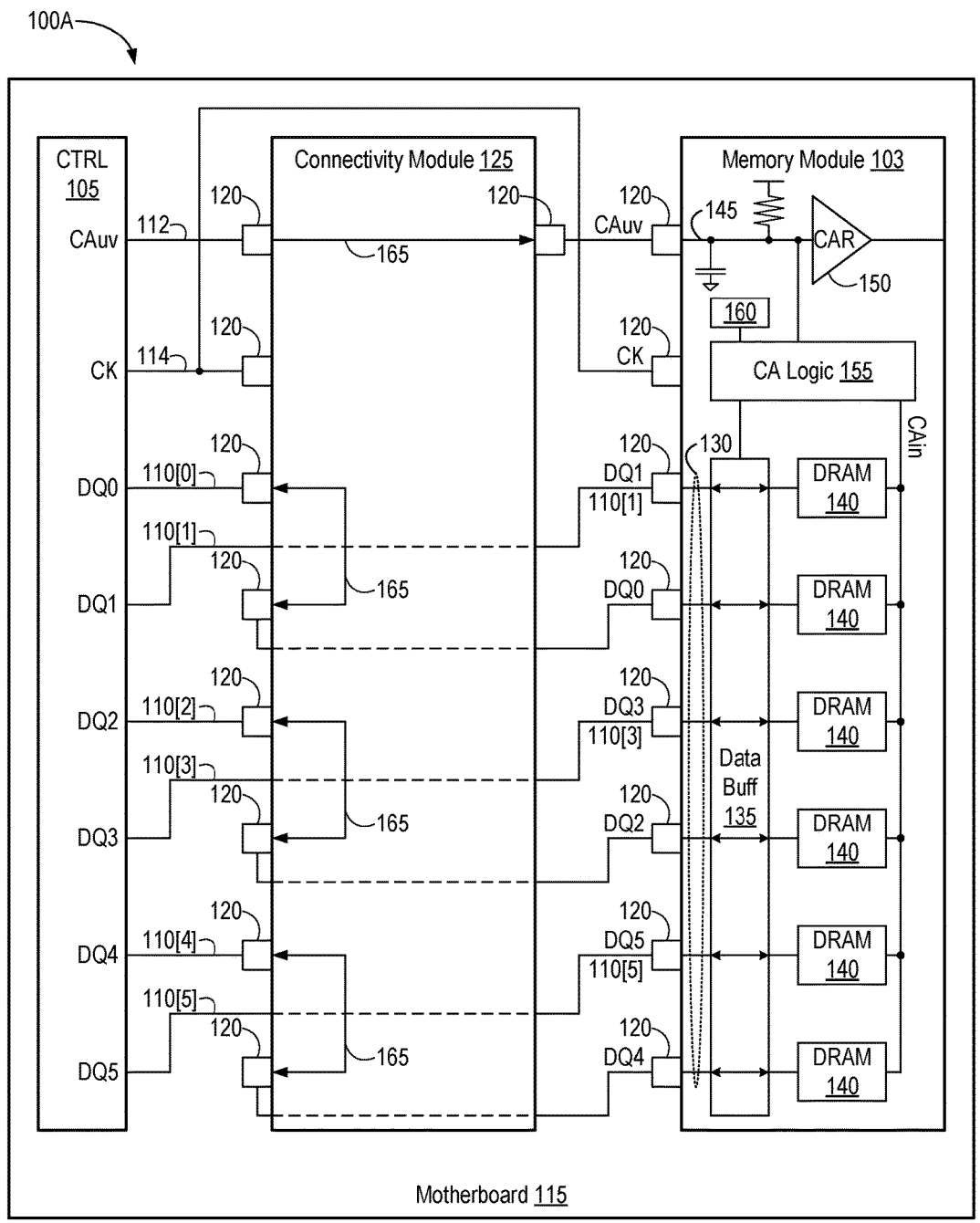
FIG. 1A depicts a memory system 100A in which a memory controller 105 communicates with a memory module 103 via point-to-point data links 110[5:0], a point-to-point command-and-address (CA) link 112, and a clock link 114.

FIG. 1A depicts a memory system 100A in which a memory controller 105 communicates with a memory module 103 via point-to-point data links 110[5:0], a point-to-point command-and-address (CA) link 112, and a clock link 114. Clock link 114 and data links 110[1,3,5] traverse a system motherboard 115 to arrive at respective pads 120 that collectively represent a module connector. Memory controller 100 can be part of a central processing unit, or can be a separate integrated circuit.

Memory module 103 is plugged into or otherwise physically connected to pads 120 to establish electrical communication between controller 105 and memory module 103. Data links 110[0,2,4] and CA link 112 also traverse motherboard 115, but are connected to memory module 103 via a connectivity module 125 included for this purpose. Connectivity module 125 includes passive electrical connections that communicate command and address signals CAuv and data signals DQ[4,2,0] to memory module 103. One or more of these connections can include active devices in other embodiments. Each of links 110[5:0], 112, and 114 includes one or more signal lines, and examples are detailed in connection with subsequent figures.

Memory module 103 includes a module data interface 130 to communicate data signals DQ[5:0] with controller 105 via signal lines external to the module. A data buffer 135 coupled between module data interface 130 and memory devices 140 manages and steers the flow of data signals between devices 140 and controller 105. Devices 140 are dynamic random-access memory (DRAM) die in this example. Among other functions, buffer 135 can be programmed to introduce propagation delays in read and write data signals. As discussed below, the programmable delay supports capacity extensions that reduce or minimize loading effects that would otherwise hinder performance. Buffer 135 also functions as a signal buffer, which in this context means that it intermediates between DRAM devices 140 and the module interface to reduce loading on links DQ[5:0]. Data buffer 135 is shown as a single component in this example, but its functionality can be divided among multiple components.

Memory module 103 additionally includes a command input port 145 to receive command and address signals CAuv from controller 105 and, also in support of capacity extensions, a command relay circuit 150 coupled to command port 145 to convey the commands and addresses from memory module 103. Relay circuit 150 is not used in this one-module example, but can be used to relay command and address signals to another memory module in systems that include one. Command logic 155 coupled to command input port 145 receives memory commands and addresses CAuv from controller 105 and responsively issues command and address signals CAin to buffer 135 and devices 140.

A register 160 stores a configuration value that directs logic 155 whether to power relay circuit 150 and how to configure the delay and steering provided by buffer 135. In this single-module example, traces 165 on connectivity module 125 passively direct command and data signals as shown so that each of links 110[4,2,0] extends via a point-to-point connection to a corresponding data port of interface 130. Data buffer 135 is configured to steer each data port to a corresponding one of DRAM devices 140 and relay circuit 150 is disabled to save power.

Memory controller 105 communicates command and address signals CAuv to initiate memory transactions (e.g., read and write transactions) to a rank of six memory devices 140. As used herein, a "rank" is a set of memory devices accessed simultaneously to read and write data. Point-to-point command and data connections facilitate fast and efficient signaling between controller 105 and memory module 103. Memory transactions and point-to-point signaling are familiar to those of skill in the art; a detailed discussion is therefore omitted for brevity.

Figure 1B:
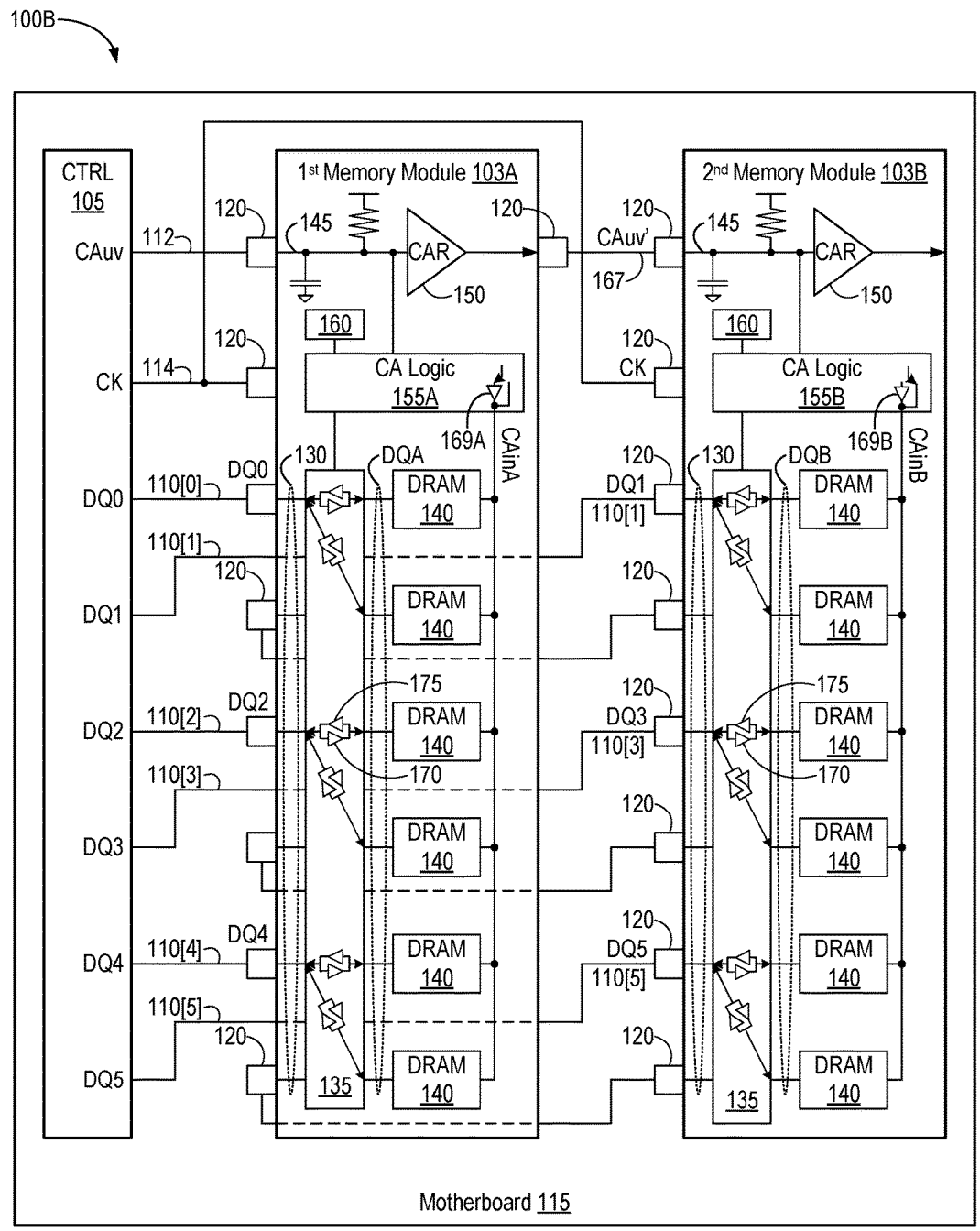
FIG. 1B depicts a memory system 100B in which a memory controller 105 communicates with a pair of memory modules 103A and 103B via respective subsets of point-to-point data links 110[5:0], point-to-point command-and-address (CA) link 112, and clock link 114.

FIG. 1B depicts a memory system 100B in which a memory controller 105 communicates with a pair of memory modules 103A and 103B via respective subsets of the point-to-point data links 110[5:0], point-to-point command-and-address (CA) link 112, and clock link 114. Memory system 100B is similar to memory system 100A of FIG. 1A, with like-identified elements being the same or similar, but accesses to a rank of six memory devices 140 are targeted to two three-device sub-ranks, one on each of memory modules 103A and 103B. Memory modules 103A and 103B can be fungible but programmed to behave differently than one another. In other embodiments memory modules 103A and 103B are purpose-built to perform in the manner detailed below.

Memory modules 103A and 103B are configured differently responsive to different configuration values in their respective registers 160. Considering memory module 103A first, register 160 is programmed to cause command logic 155 to enable relay circuit 150 to convey command and address signals CAuv to memory module 103B as delayed signals CAuv'. Relay circuit 150 is configured to impose a delay of one period of clock signal CK in this embodiment, and to deliver delayed signals CAuv' to memory module 103B via a point-to-point interface 167. A selectable delay element 169A in command logic 155A is configured to impose a delay of one period of clock signal CK to match the delay through relay circuit 150 in delivering signals CAinA. In module 103B, relay circuit 150 is powered down and selectable delay element 169B omits the delay imposed by the same element in module 103A. Command and address signals CAinA and CAinB thus arrive at their respective DRAM devices 140 at approximately the same time.

This two-module configuration provides point-to-point connections for each data link. To accomplish this, data buffer 135 in each of memory modules 103A and 103B is configured to connect its respective DRAM devices 140 to only half the data links, links 110[4,2,0] for memory module 103A and links 110[5,3,1] for memory module 103B (each DQ can be steered to two different DRAMs, with the steering selection provided by CA logic 155A and 155B depending on address and/or rank). Switchable buffers 135 in both memory modules 103A and 103B are additionally configured to include delay elements 170 in the write-data signal paths. Delay elements 170 delay write data on interfaces DQA and DQB one clock cycle to match the additional clock cycle of delay imposed on signals CAinA and CAinB. In the read direction, controller 105 adjusts its strobe-enable window to account for the delay Dly1 imposed by CA logic 155A/B and the delay through data buffers 135, but the additional cycle of delay imposed by data buffers 135 for the write case is not required. Delay elements 175 in the read direction represent this retiming delay for data moving between subranks of the DRAM devices 140 and links 110[5:0].

FIGS. 1C and 1D depict additional configurations of data buffer 135. Memory modules 103 can be adapted for use in systems that employ more than two modules for increased memory capacity. Some such systems are detailed below and depicted in FIGS. 3A-3E. In support of such configurations, data buffer 135 on each module 103 can selectively connect each one of two data interfaces to three different DRAMs (FIG. 1C) or selectively connect only one data interface to six different DRAMs (FIG. 1D). Delays can be imposed in the data paths in the manner noted above.

FIG. 2 is a timing diagram 200 illustrating a write transaction for the two-module memory system 100B of FIG. 1B. Signal names on the vertical axis correspond to like-identified nodes in FIG. 1B. (In general, signals and their corresponding signal paths are similarly identified. Whether a given reference is to a signal or signal path will be clear in context.) Time, along the horizontal axis, may not be representative of a practical device, but is simplified for ease of illustration. The general timing of memory transactions (e.g., read and write transactions) is well understood by those of skill in the art.

The write transaction starts when controller 105 issues a write command WR on CA link 112 as signal CAuv. Relay circuit 150 of memory module 103A imposes a delay Dly1 of one clock cycle and conveys the resultant delayed signal CAuv' to memory module 103B. CA logic 155 in each module interprets write command WR to derive the appropriate command and address signals for their respective DRAM devices 140, a process that imposes a delay Dly2. Delay circuit 169A delays signal CAinA by delay Dly1 to generally align the timing of signal CAinA on module 103A with signal CAinB on module 103B. The DRAM devices 140 on both memory modules 103A and 103B thus receive their respective write commands and addresses CAinA and CAinB simultaneously. (In this context, "simultaneous" means timed to the same edge of a reference signal, although propagation delays may prevent alignment of those same edges on different modules.) Data buffers 135 delay write data signals DQ[5:0] by delay Dly1 to account for the similar delay imposed on signals CAinA and CAinB. DRAM devices 140 ultimately store the data responsive to signals CAinA and CAinB (although CA and DQ signals are shown aligned, fixed and/or programmable write latencies may offset the two by some number of clock cycles in an actual system). Read transactions are similar, but do not require data buffers 135 to impose the additional clock-cycle of delay.

Memory systems 100A and 100B offer single- and dual-module alternatives in which all data and command links are advantageously point-to-point in support of high data rates. This advantage comes at a cost of one clock cycle of latency. Other embodiments support point-to-point connectivity for greater numbers and more combinations of modules, in which case the relative importance of a small latency penalty diminishes.

Figure 3A:
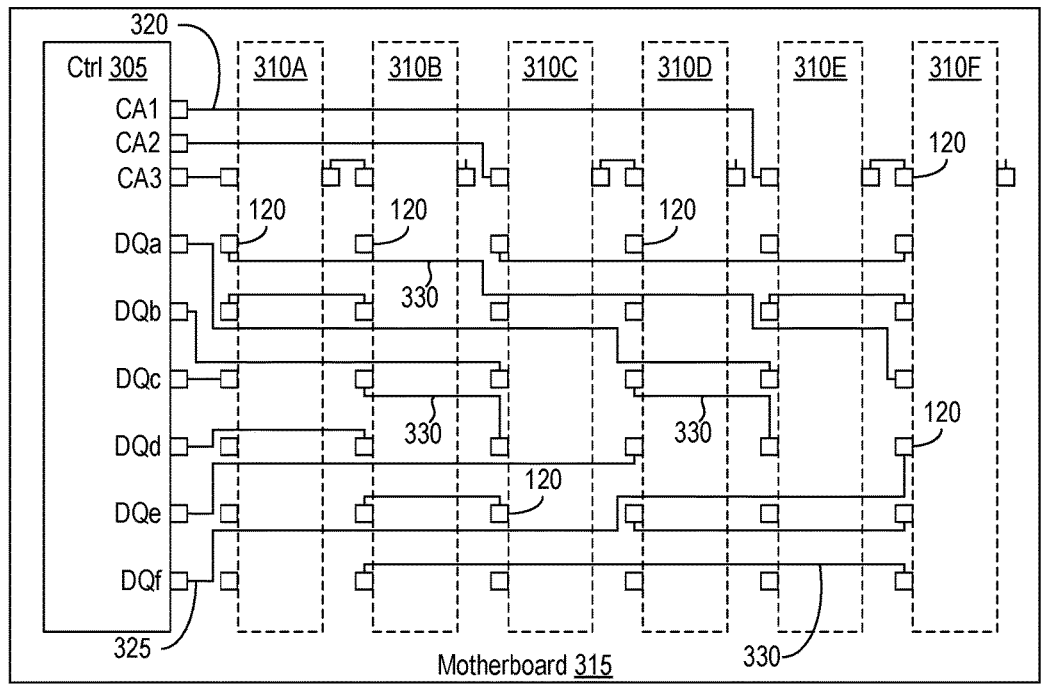
FIG. 3A depicts a memory system in which a memory controller 305 can communicate with up to six memory modules installed in slots 310 via point-to-point connections that extend across a motherboard 315.

FIG. 3A depicts a memory system in which a memory controller 305 can communicate with up to six memory modules installed in slots 310 via point-to-point connections that extend across a motherboard 315. Each slot 310 represents e.g. a module connector or collection of surface-mount electrical contacts.

Memory controller 305 includes three CA ports CA[3:1] and six data ports DQ[a:f]. CA ports CA[3:1] issue identical command and address signals to three of the six slots 310 via point-to-point links 320. Each data port communicates directly with one of slots 310 via a respective data link 325. Additional links 330 extending between slots 310 can be used in conjunction with connectivity modules to establish other point-to-point links, as detailed in the following examples.

Figure 3B:
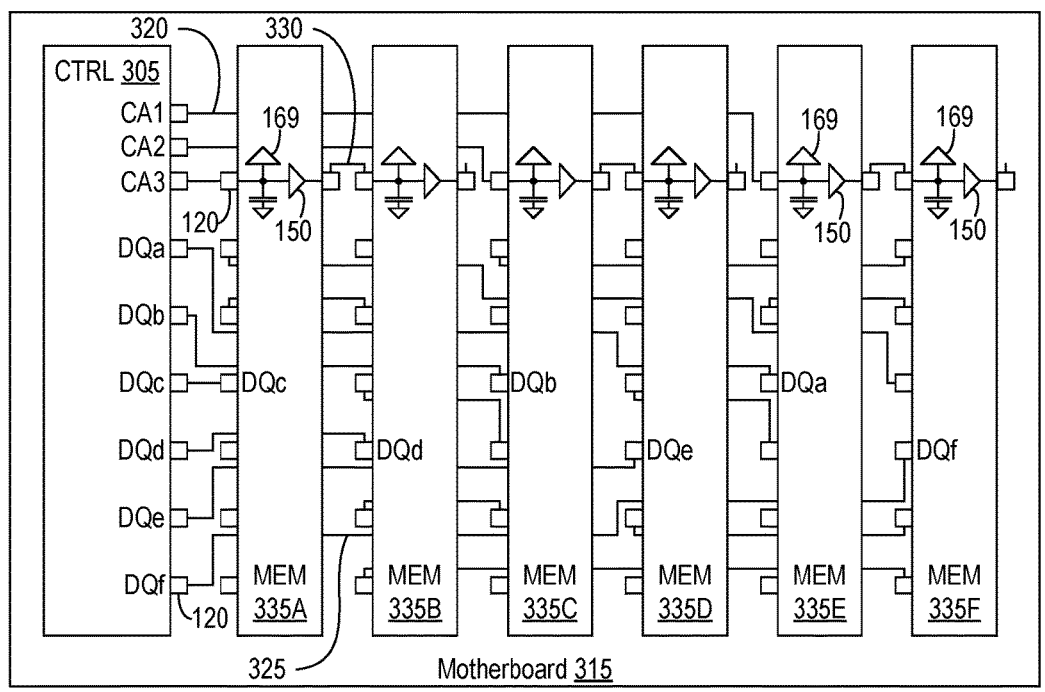
FIG. 3B depicts the memory system of FIG. 3A in which each slot 310 is equipped with one of six fungible, configurable memory modules 335[A:F].

FIG. 3B depicts the memory system of FIG. 3A in which each slot 310 is equipped with one of six fungible, configurable memory modules 335[A:F]. Modules 335[A:F] are similar to memory modules 103A and 103B of FIGS. 1A and 1B, for example including relay circuit 150 and delay element 169 that function as explained previously. Other features of modules 335[A:F] are omitted so as not to obscure the connectivity that supports this six-module configuration.

Each memory module includes a data buffer like buffer 135 of FIGS. 1A and 1B that allows the module to connect DRAMS for a given command to communicate via one, two, three, or all six data ports DQ[a:f]. With six modules installed, each module 335 is configured to read and write via just one of its data ports. Controller 305 has three CA ports CA[1:3]. Pairs of modules are configured as in the example of FIG. 1B such that both are associated with one CA port, with one module in a pair relaying command and address signals to the other. For example, module 335E receives signals CA1 via a point-to-point link 320 and relays those signals to module 335F via a relay circuit 150. Delay element 169 and relay circuit 150 are configured as detailed in connection with FIG. 1B. All the data and command links are advantageously point-to-point, albeit at the cost of an additional clock cycle of delay.

Figure 3C:
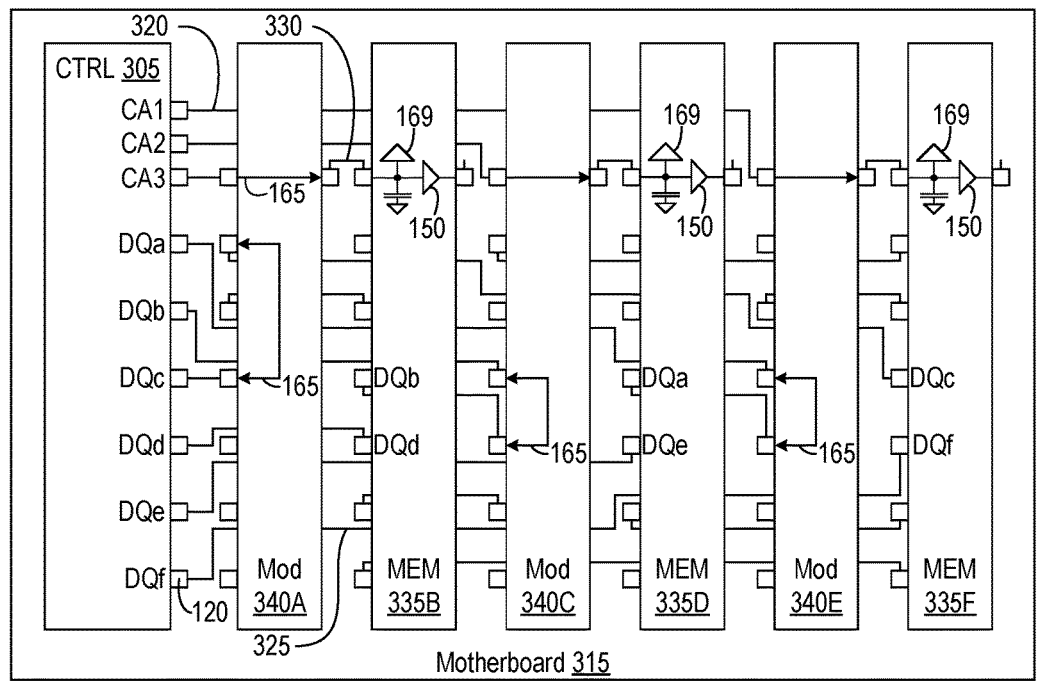
FIG. 3C depicts the memory system of FIG. 3A in which three of slots 310[A:F] are equipped with a memory module (335B, 335D, and 335F) and three are equipped with a conductivity module (340A, 340C, and 340E) that provides connectivity via traces 165.

FIG. 3C depicts the memory system of FIG. 3A configured with three of slots 310[A:F] equipped with a memory module (335B, 335D, and 335F) and three slots equipped with a connectivity module (340A, 340C, and 340E) that provides connectivity via traces 165. There are three CA links CA[1:3], one for each module, so none of the command and address signals are buffered. The CA logic and relay circuitry (FIG. 1A) is thus programmed as in the single-module example of FIG. 1A and the additional clock cycle of delay is avoided. The data buffer on each module 335B, 335D, and 335F is configured to exchange read and write data with the controller via just two of the six data ports. As before, all the data and command links are point-to-point.

Figure 3D:
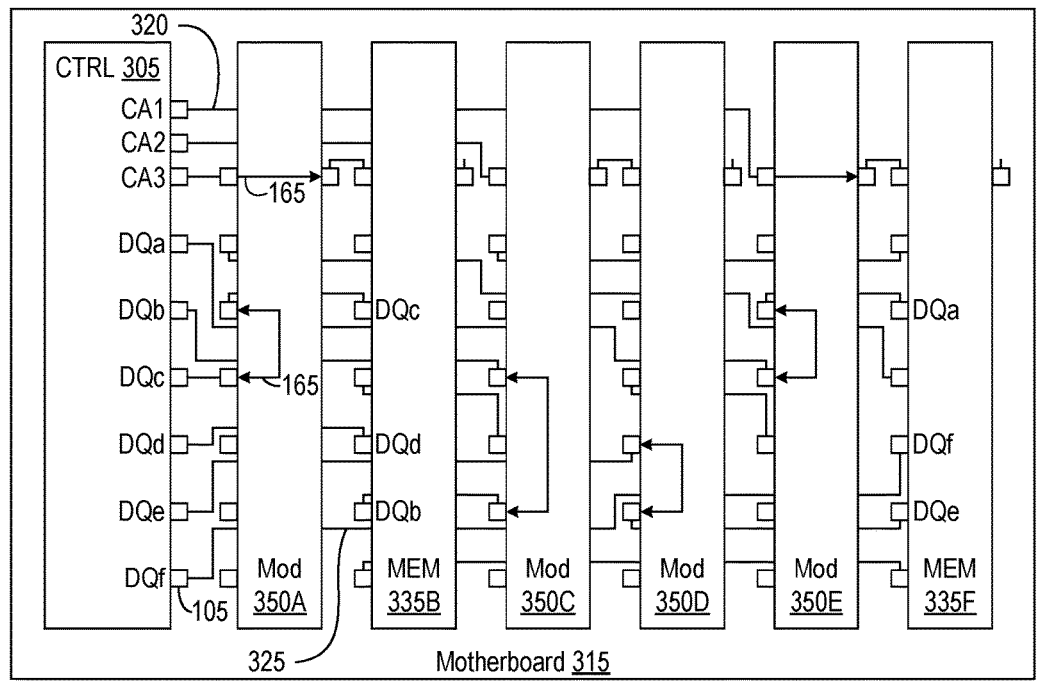
FIG. 3D depicts the memory system of FIG. 3A in which two of slots 310[A:F] are equipped with a memory module (335B and 335F) and four are equipped with conductivity modules (350A, 350C, 350D, and 350E) that provide connectivity via traces 165.

FIG. 3D depicts the memory system of FIG. 3A configured with two of slots 310[A:F] equipped with a memory module (335B and 335F) and four slots equipped with connectivity modules (350A, 350C, 350D, and 350E) that provide connectivity via traces 165. The command link for CA2 is not used, and none of the command and address signals are buffered. The CA logic and relay circuitry (FIG. 1A) is thus programmed as in the single-module example of FIG. 1A. The data buffer on each module 335B and 335F (FIG. 1A) is configured to exchange read and write data with the controller via just three of the six data ports, and all the data and command links are advantageously point-to-point.

Figure 3E:
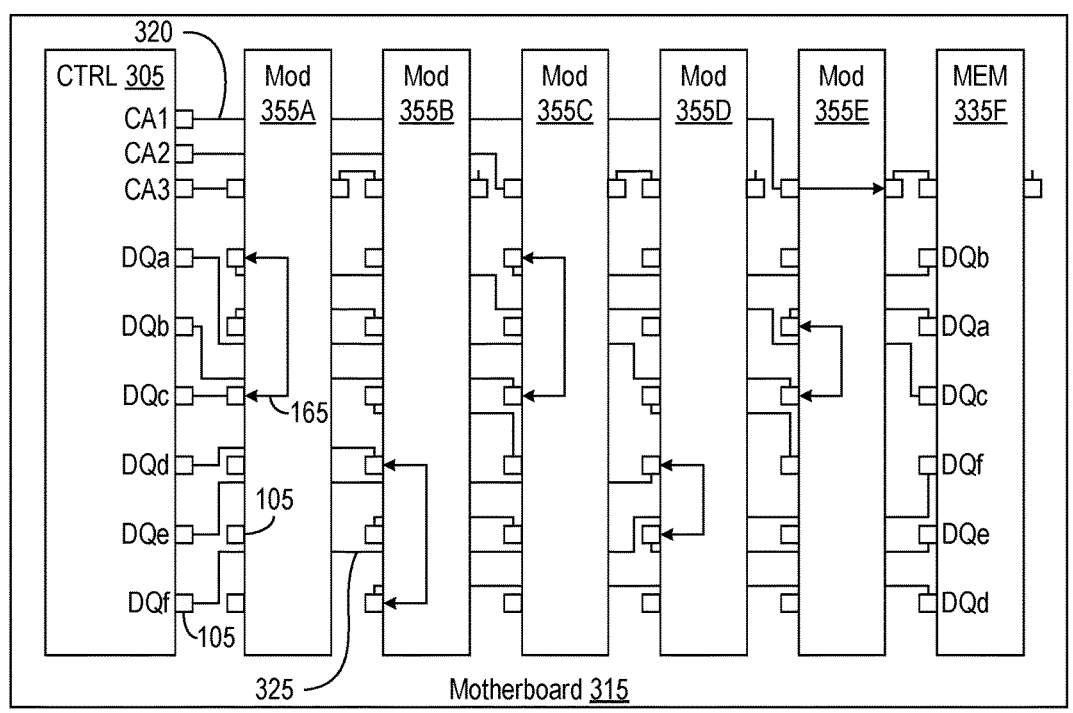
FIG. 3E depicts the memory system of FIG. 3A in which one of slots 310[A:F] is equipped with a memory module (335F) and five are equipped with conductivity modules (350A, 350B, 350C, 350D, and 350E) that provide connectivity via traces 165.

FIG. 3E depicts the memory system of FIG. 3A configured with one of slots 310[A:F] equipped with a memory module (335F) and five slots equipped with connectivity modules (355A, 355B, 355C, 355D, and 355E) that provide connectivity via traces 165. The command links for CA2 and CA3 are not used, and none of the command and address signals are buffered. The CA logic and relay circuitry (FIG. 1A) of module 335F is thus programmed as in the single-module example of FIG. 1A, and the data buffer on module 335F (FIG. 1A) is configured to exchange read and write data with the controller via all six data ports. The data and command links are all point-to-point.

Figure 4A:
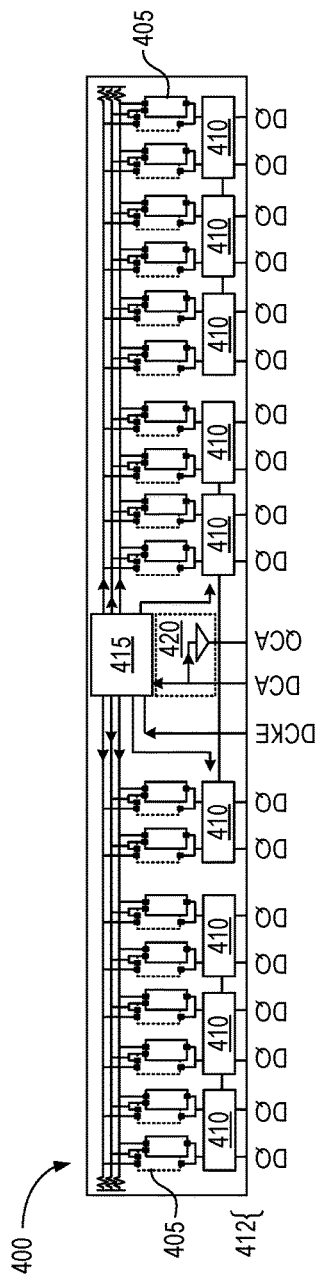
FIG. 4A depicts a configurable, variable-data-width memory module 400 in accordance with another embodiment.

FIG. 4A depicts a configurable, variable-data-width memory module 400 in accordance with another embodiment. Module 400 includes eighteen DRAM components 405 on each side, for a total of 36 components. Each component 405 includes two ×4 DRAM devices, so module 400 includes a total of 72 DRAM devices. Different data widths and different numbers of components and devices can be used in other embodiments.

Module 400 includes three sets of three interconnected data-buffer components 410, or "data buffers." Each set of three components steers data from twelve DRAM components 405 to and from six data ports DQ of a module interface 412. Each DRAM component 405 communicates four-bit-wide (×4, or a "nibble") data DQ and complementary strobe signals DQS and/DQS, for a total of six data bus connections. Data-buffer components 410 in each interconnected group of three can transfer data laterally between themselves.

A command-buffer component (CAB) 415—alternatively called a "Registered Clock Driver" (RCD)—interprets command, address, and chip-select signals on a command port DCA to control memory components 405, data buffers 410, and a relay circuit 420 that can selectively forwards signals on port DCA to another module via port QCA with one clock cycle of delay. A clock-enable port DCKE issues clock-enable signals used to control the power state of e.g. CAB 415 in a manner discussed below. DQ buffers 410, CAB 415, and relay circuit 420 are all part of a buffer system 417 that provides complete buffering of command, address, clock, and data signals. The buffer system can have more or fewer components, and can buffer more or fewer signals or signal types in other embodiments.

Module commands on port DCA direct module 400 to perform memory operations, such as to read from or write to components 405. Addresses associated with the commands identify target collections of memory cells (not shown) in components 405, and chip-select signals associated with the commands allow CAB 415 to select subsets of integrated-circuit devices, or "chips," for both access and power-state management. A differential clock signal (FIG. 6) provides reference timing from module 400. Buffer components 410 and CAB 415 each act as a signal buffer to reduce loading on module interface 412. This reduced loading is in large part due to the fact that each buffer component presents a single load to module interface 412 in lieu of the multiple DRAM devices each buffer component serves.

The leftmost three buffer components 410 can connect one device to one of the six ×6 data/strobe ports DQ/DQS, three devices to three of ports DQ/DQS, or six devices to the six ports DQ/DQS. The center and rightmost collections of three buffer components 410 offer similar connectivity. Buffers 410 are "dual-nibble" buffers in this example, and each serves ×4 DRAM devices. However, data widths and the ratio of memory components 405 to data buffers 410 can be different, and some or all of the steering and delay functionality attributed to buffers 410 can be incorporated into the memory devices or elsewhere in memory components 405.

The extra buffer 410 and related DRAM components 405 on the right side of module 400 are included in this embodiment to support error checking and correction (ECC). For example, a form of ECC developed by IBM and given the trademark Chipkill™ can be incorporated into module 400 to protect against any single memory device failure, or to correct multi-bit errors from any portion of a single memory device. Buffer components 410 can steer data as necessary to substitute a failed or impaired device.

Figure 4B:
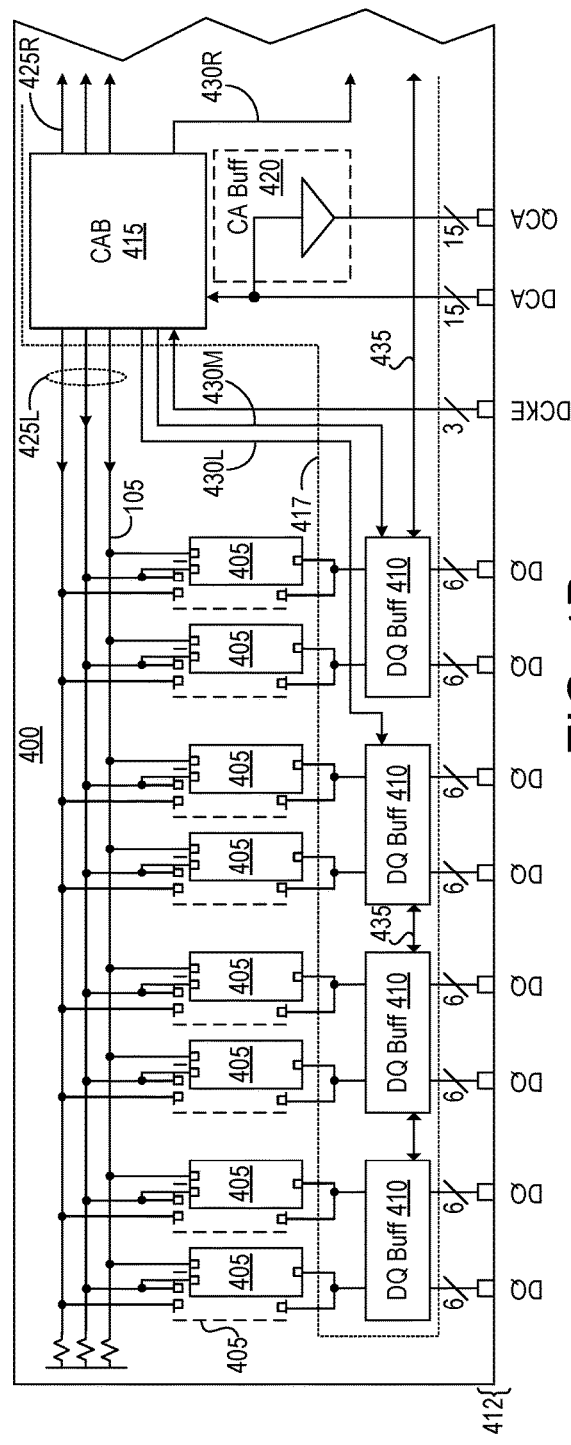
FIG. 4B depicts the left side of module 400 of FIG. 4A enlarged for ease of illustration.

FIG. 4B depicts the left side of module 400 of FIG. 4A enlarged for ease of illustration. Module 400 is backward compatible with what is conventionally termed a "DDR4 LRDIMM chipset." DDR4 (for "double-data-rate, version 4") is a type of DRAM device, and LRDIMM (for "load-reduced, dual inline memory module") is a type of memory module that employs a separate system of buffers to facilitate communication with the memory devices. Those of skill in the art are familiar with both DDR4 memory and LRDIMM modules, so detailed treatments of these technologies are omitted here. The following discussion highlights aspects of DDR4 LRDIMM circuitry relevant to certain improvements.

DQ buffers 410 are disposed across the bottom of module 400 to minimize stub lengths and concomitant skew between data bits. The operation of module 400 in an LRDIMM mode is consistent with that of LRDIMM server components that employ DDR4 memory. Briefly, CAB 415 registers and re-drives signals from the memory controller to access DRAM components 405. CAB 415 interprets each controller command (e.g., in a manner consistent with the DDR4 specification) and conveys corresponding commands to DRAM components 405 via secondary buses 425L and 425R. The signals for secondary busses 425L and 425R are specific to the installed memory devices, and the timing, format, and other parameters of those signals are specified for commercially available devices in a manner well understood by those of skill in the art.

DQ buffers 410 provide load isolation for read, write, and strobe signals to and from components 405, and each buffer receives control signals via one of private busses 430L, 430M, and 430R to e.g. prepare them for the direction of data flow. Private busses 430L, 430M, and 430R can also convey mode-selection information that can alter the way buffers 410 convey data. For example, CAB 415 can configure buffers 410 to induce required delays and to steer data for different configurations of subranks to all or a specified subset of the DQ ports. Connections 435 between buffers 410 convey commands and configuration information from CAB 415, and also communicate data in configurations that steer data.

Figure 5A:
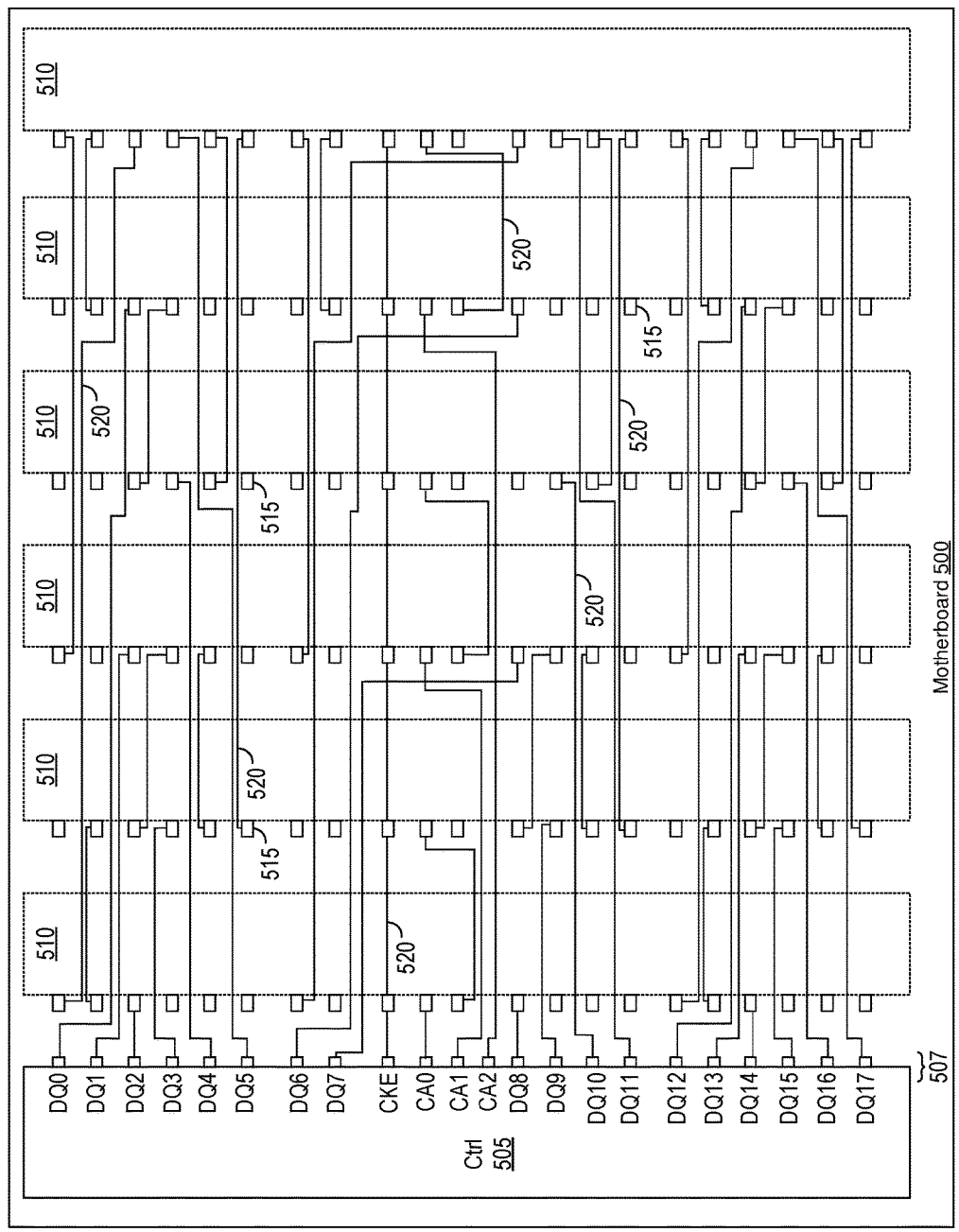
FIG. 5A depicts a motherboard 500 supporting a memory system that includes a controller component 505, six connectors 510 to receive respective memory modules, and contacts 515 and traces 520 to service those connectors.

FIG. 5A depicts a motherboard 500 supporting a memory system that includes a controller component 505, six connectors 510 to receive respective memory modules, and contacts 515 and traces 520 to service those connectors. Using connectivity modules as needed, motherboard 500 can support one, two, three, or six modules in the manner discussed previously in connection with FIGS. 3A-3E.

Figure 5B:
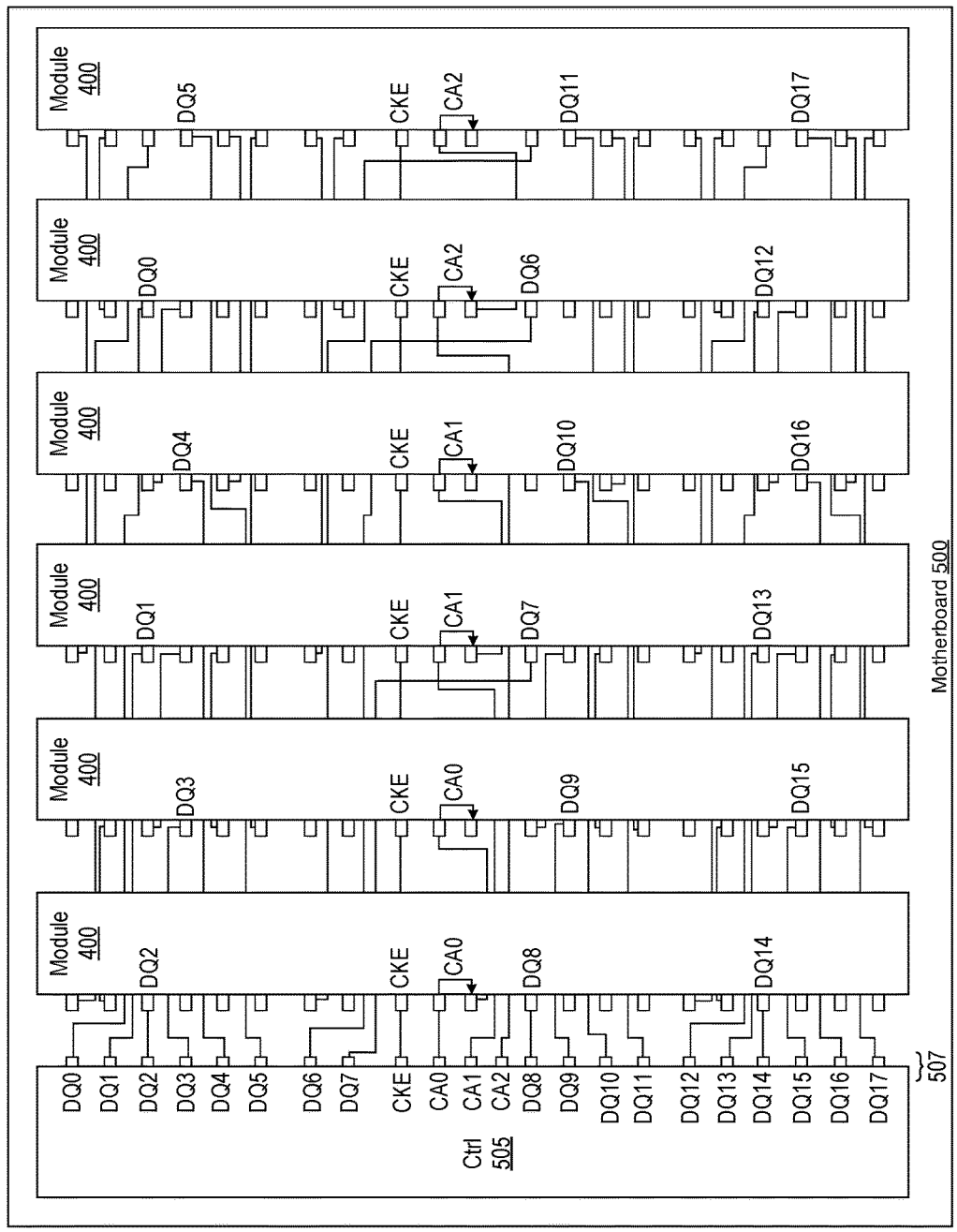
FIG. 5B depicts motherboard 500 of FIG. 5A with six installed modules 400.

FIG. 5B depicts motherboard 500 of FIG. 5A with six installed modules 400. The data buffers 410 (see FIGS. 4A and 4B) of each module are configured in this configuration to each communicate via a single data port DQ. Rather than the generic label "DQ" used in FIGS. 4A and 4B, the ports on each module 400 are labeled with a respective identifier from controller component 505 to readily illustrate the point-to-point signal paths between controller component 505 and each module 400. As in the example of FIG. 3B, controller component 505 has three command ports CA[2:0], and pairs of modules are configured as in the example of FIG. 1B such that both share one command port, with one module of each pair relaying command and address signals to the other. For example, the leftmost module 400 receives signals CA0 via a point-to-point link and relays those signals to the adjacent module 400 via a relay circuit 420 (FIG. 4B). The relays and buffers are configured as detailed in connection with FIG. 1B.

Figure 5C:
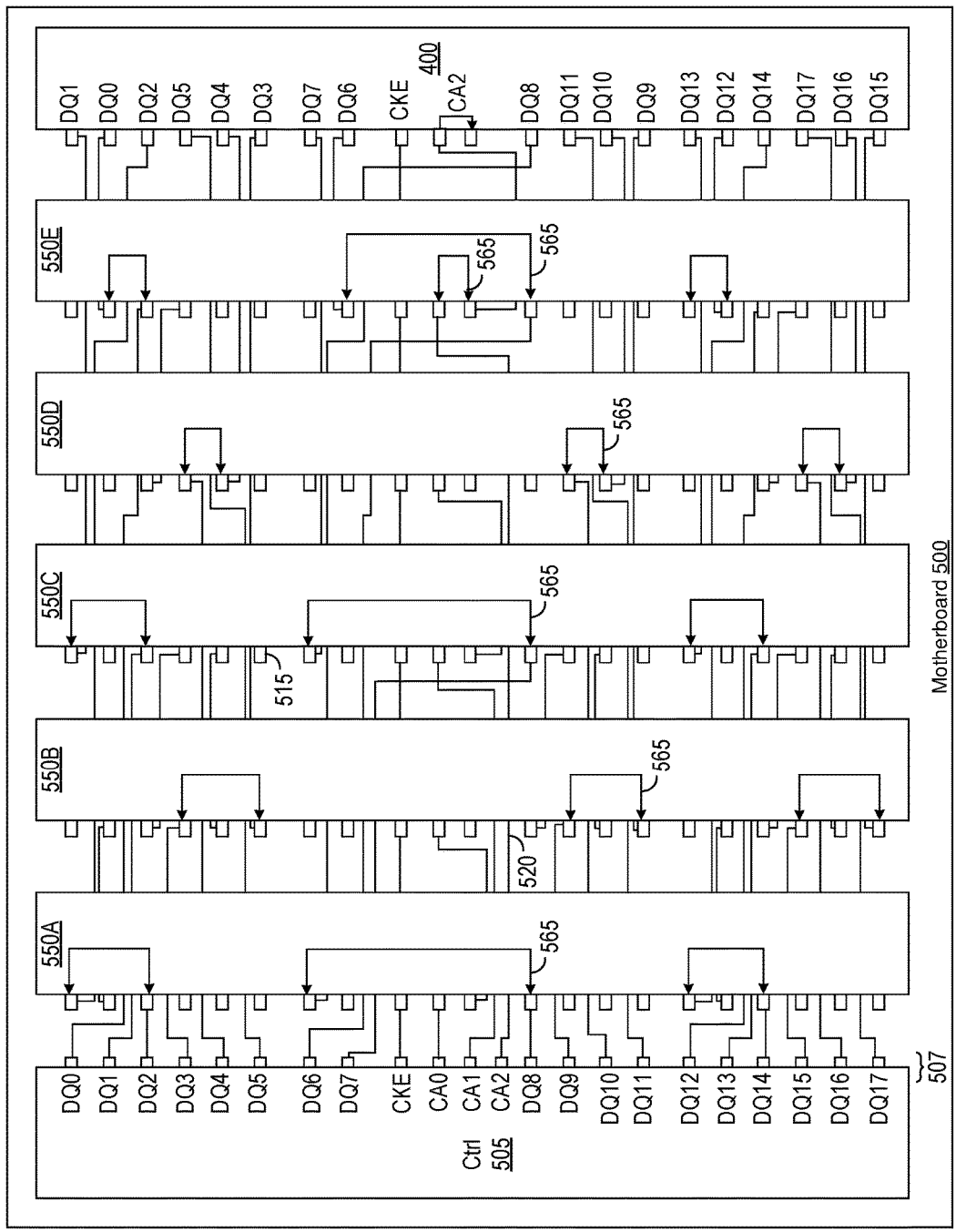
FIG. 5C depicts the memory system of FIG. 5A in which one of the available connectors is equipped with a memory module 400 and the remaining five connectors are equipped with conductivity modules (550[A:E]) that provide connectivity via traces 565.

FIG. 5C depicts the memory system of FIG. 5A in which one of the available connectors is equipped with a memory module 400 and the remaining five connectors are equipped with connectivity modules (550[A:E]) that provide connectivity via traces 565. The command links for CA0 and CA1 are not used, and none of the command and address signals are buffered. The CA logic and relay buffer (see FIG. 4A) of module 400 are thus programmed as in the single-module example of FIG. 1A, and module 400 is configured to read and write via all eighteen data ports DQ[17:0].

Figure 5D:
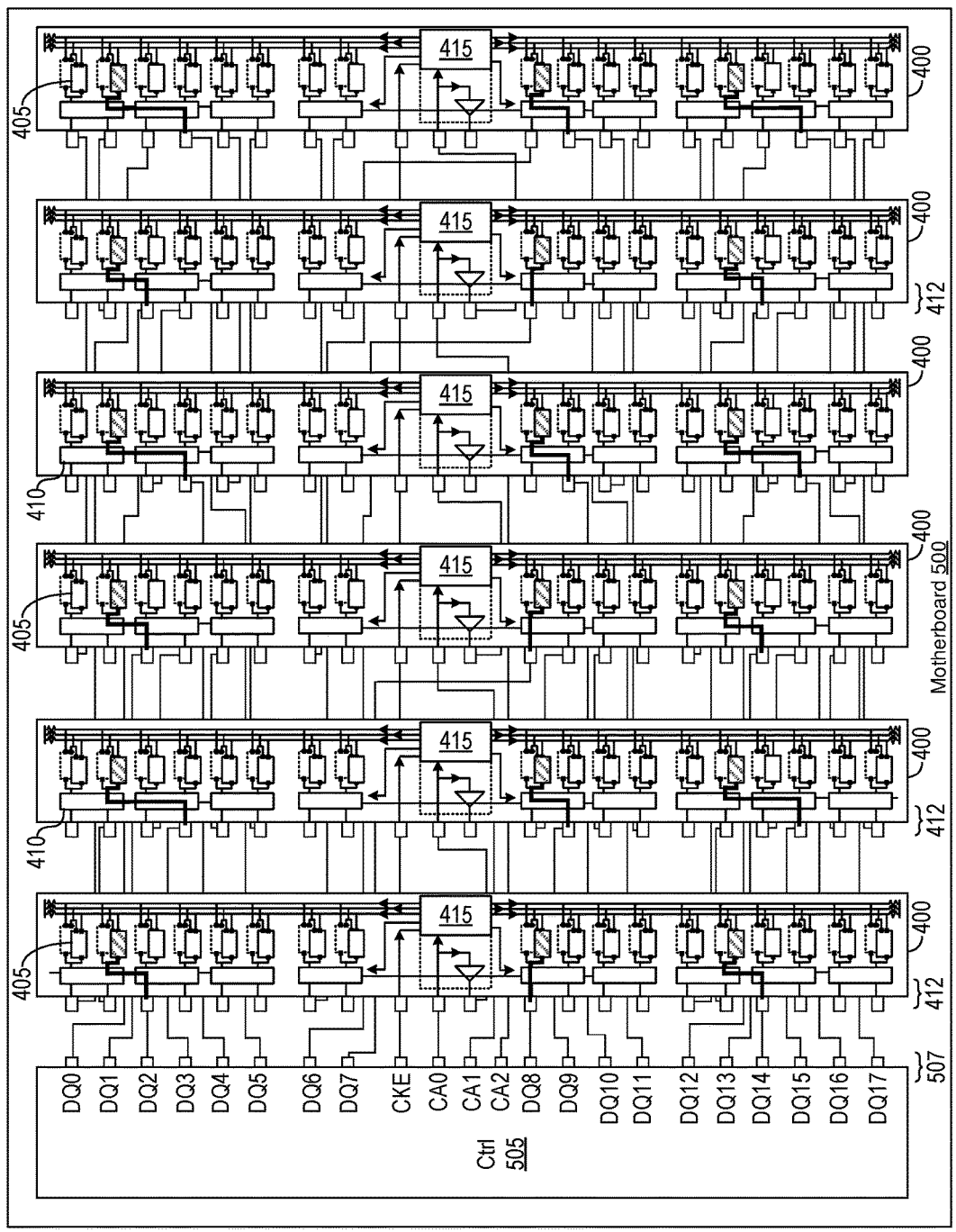
FIG. 5D, like FIG. 5B, depicts motherboard 500 with six installed modules 400.

FIG. 5D, like FIG. 5B, depicts motherboard 500 with six installed modules 400. As detailed in FIGS. 4A and 4B, each module 400 includes nine data buffers 410, each directly connected to four memory components 405, and each component 405 includes two DRAM devices (not shown). Each module therefore includes 9×4×2=72 DRAM devices, and the six-module system of FIG. 5D includes 72×6=432 DRAM devices.

Data connectivity is distributed from controller component 505 to the six modules in the manner detailed in connection with FIGS. 5A and 5B. Controller component 505 includes a controller interface 507 with eighteen ×4 data ports DQ[17:0], three of which are served by each of the six modules 400. The leftmost module 400, for example, services ports DQ[2,8,14] in this embodiment. Still referencing the leftmost module 400, CAB 415 and data buffers 410 steer signals from three selected DRAM devices to ports DQ[2,8,14] for every read or write transaction. The remaining modules 400 similarly steer data to and from three data ports to an active set of three DRAM devices for each transaction.

FIG. 5D illustrates an active rank of eighteen DRAM devices by cross-hatching three DRAM components 405 on each module 400. Bold lines highlight the connectivity provided by data buffers 410 at the direction of CAB 415. Each module 400 supports 24 such combinations of three-device "sub-ranks," giving the six-module system support for 24 eighteen-device ranks. As used herein, a "sub-rank" is a module-specific fraction of a memory rank, with the rank distributed across multiple memory modules.

Each memory transaction activates an entire rank. In some memory systems, a rank refers to a set of memory devices on one module and connected to the same chip-select for simultaneous access. Memory modules commonly include multiple ranks. Assuming modules of the type and capacity of module 400, such a module would enable one of a number of eighteen-device ranks on each module for each memory transaction. Enabling a memory device consumes power, so enabling eighteen devices on each module when only three are required, or 108 devices in a system when only eighteen are required, is wasteful. Embodiments of module 400 are thus adapted to afford considerably greater activation granularity than was previously available in this type of memory system. In particular, CAB 415 and DQ buffer 410 support sub-rank activation granularities that considerably reduce power consumption when ranks are distributed across memory modules.

Figure 6A:
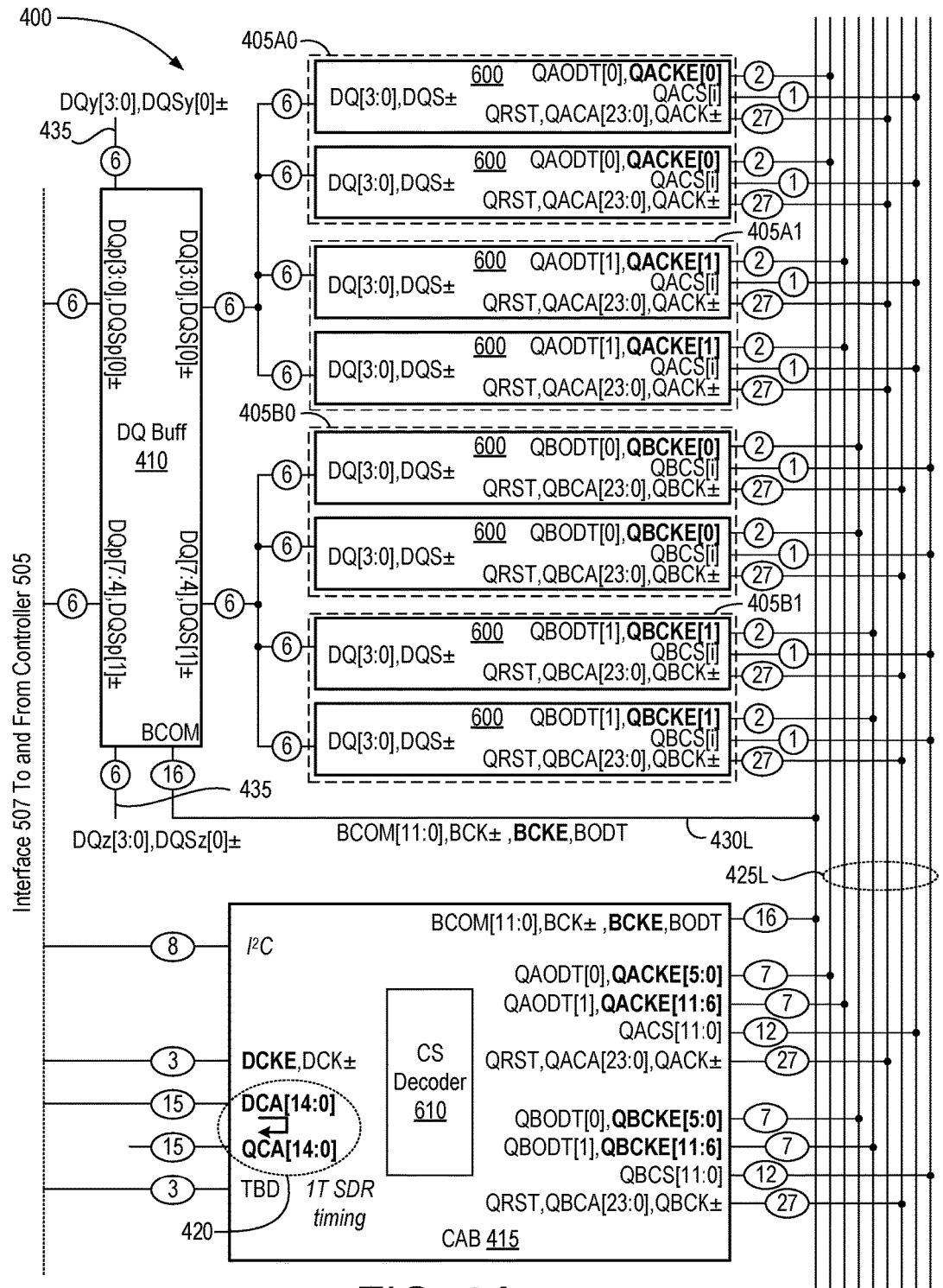
FIG. 6A details a portion of memory module 400, introduced in FIGS. 4A and 4B, highlighting features and connectivity that support power-efficient access granularity.

FIG. 6A details a portion of memory module 400, introduced in FIGS. 4A and 4B, highlighting features and connectivity that support power-efficient access granularity. Relay circuit 420 is shown as an arrow forwarding signals DCA[14:0] as signals QCA[14:0]. The purpose of relay circuit 420 is as detailed previously. CAB 415 is shown with one of the nine data buffers 410 and the four DRAM components 405 with which the buffer directly communicates. As noted previously, in some configurations buffer 410 communicates with DRAM components 405 via adjacent buffers 410 via connections 435. Each component 405 includes a pair of DRAM devices 600, and the four components 405 associated with one buffer 410 are distinguished using a two-place alphanumeric designation (A0, A0, B0, and B1). Each device 600 is distinguished using similar alphanumeric designations for the ports on secondary bus 425L. Secondary bus 425L, private bus 430L, data connections 435, and their associated signal names are detailed relative to their introduction in FIGS. 4A and 4B.

DQ buffer 410 includes two "nibble" data ports DQp[3:0], DQSp[0]± and DQp[7:4], DQSp[1]± on the controller side (or "processor" side), where "DQSp[#]±" specifies two-line differential strobes; and includes similar data ports DQ[3:0], DQSp[0]± and DQ[7:4], DQSp[1]± on the DRAM side. Data connections 435 convey data and strobe signals on lines DQy[3:0], DQSy[0]± in support of width configurability as noted previously, and ×16 commands BCOM[11:0], BCK±, BCKE, BODT on private bus 430L direct data and otherwise configure buffer 410. These signals are generally well documented and understood by those of skill in the art, with a few modifications detailed below. Briefly, signal BCOM[11:0] receives commands that tell buffer 410 which DRAM device 600 to communicate with and how to steer the data. BCK± is a differential clock signal, BCKE is a clock-enable signal that allows buffer 410 to e.g. selectively power its interface circuits for improved efficiently, and BODT controls on-die-termination elements in buffer 410 for impedance matching.

Each DRAM device 600 communicates with buffer 410 via a data-and-strobe port DQ[3:0], DQS±, and communicates with CAB 415 over secondary bus 425L via ports QA/BODT[#], QA/BCKE[#]; QA/BCS[i]; and QRST, QA/BCA[23:0], QA/BCK±. Devices 600 are conventional, and their input control signals and ports are well documented and understood by those of skill in the art. Briefly, signals QA/BODT[#] control the on-die termination values for each DRAM device 600; signals QA/BCKE[#] (the "CKE" for "clock-enable"), are used to switch devices 600 between active and low-power states; QA/BCS[i] are chip-select signals that determine which of the eight devices 600, if any, is active for a given memory transaction; QRST is a reset signal common to all devices 600; QA/BCA[23:0] are command and address ports; and QA/BCK±receive a differential clock signal that serves as a timing reference.

CAB 415 includes a number of conventional circuits that are omitted here for brevity. Such circuits may include a phase-locked loop, training and built-in self-test (BIST) logic, a command buffer, and a command decoder. These and other circuits are well understood by those of skill in the art, and details unrelated to the present disclosure are omitted for brevity. The primary signals employed to increase enable granularity in support of improved power efficiency are highlighted in bold font.

At the left in CAB 415: (a) a sideband port I²C can be used to communicate low-speed signals for e.g. controlling CAB 415 before the main command port is calibrated; (b) clock-enable signal DCKE is accompanied by a differential clock signal DCK±; and (c) command interface DCA[14:0] receives commands in sets of two consecutive fifteen-bit chucks so that each command is up to thirty bits (e.g., six chip-select bits, one parity bit, one activate bit, two group address bits, two bank-address bits, and eighteen lower-order address bits).

At the right in CAB 415: (a) a sixteen-bit port communicates command signals BCOM[11:0], a differential clock signal BCK±, clock-enable signal BCKE, and on-die-termination signal BODT to data buffers 410; (b) signal QAODT[0] controls on-die termination, and memory-device clock-enable signals QACKE[5:0] control clock-enable for the DRAM devices 600 in component 405A0 for each DQ buffer 410; (c) signal QAODT[1] controls on-die termination and clock-enable signals QACKE[11:6] control clock-enable for the DRAM devices 600 in component 405A1 for each DQ buffer 410; (d) memory-device chip-select signals QACS[11:0] are chip-select signals to each DRAM device 600 in components 405A0 and 405A1 for each DQ buffer 410; (e) signals QRST, QACA[23:0], QACK±reset, issue commands, and express acknowledge signals to the DRAM devices 600 in components 405A0 and 405A1 for each DQ buffer 410 (f) signal QBODT[0] controls on-die termination and clock-enable signals QBCKE[5:0] control clock-enable for the DRAM devices 600 in component 405B0 for each DQ buffer 410; (g) signal QBODT[1] controls on-die termination and clock-enable signals QBCKE[11:6] control clock-enable for the DRAM devices 600 in component 405B1 for each DQ buffer 410; (h) signal QBCS[11:0] issues chip-select signals to each DRAM device 600 in components 405B0 and 405B1 for each DQ buffer 410; and (i) signals QRST, QBCA[23:0], QBCK±reset, issue commands, and express acknowledge signals to the DRAM devices 600 in components 405B0 and 405B1 for each DQ buffer 410.

CAB 415 drives twenty-four memory-device clock-enable signals, QACKE[11:0] and QBCKE[11:0], for power-state control. Each clock-enable signal is conveyed from a clock-enable node on CAB 415 to a group of three devices 600. The twenty-four clock-enable ports corresponding to clock-enable signals QACKE[11:0] and QBCKE[11:0] thus support all 72 memory devices (3×24=72) with three-device enable granularity.

Clock-enable signals QACKE[11:0] and QBCKE[11:0] can be used to selectively direct ranks or sub-ranks of memory devices 600 to respond to commands to enter or exit a self-refresh state or a power-down state. (Suitable commands are discussed below.) CAB 415 can be programmed to assert sets of clock-enable signals QACKE[11:0] and QBCKE[11:0] to combine one or more groups of three memory devices in support of different module-width configurations. Using the example of the memory system of FIGS. 5A-5D, in an N-module memory system, 18/3N sets of three devices can be enabled on each module to enable a full rank of eighteen devices. Motherboard 500 includes six modules in FIG. 5D, so each module 400 enables one (18/3(6)=1) three-device sub-rank, using a correct one of the 24 secondary CKEs in that example. A rank of eighteen devices is thus distributed across the six modules 400 when the motherboard is fully populated. Motherboard 500 includes one module in FIG. 5C, so that one module 400 enables six (18/3(1)=6) three-device sub-ranks at a time, using six of the 24 secondary CKEs, to enable a full eighteen-device rank.

Controller component 505 (FIG. 5A) issues commands DCA[14:0] and clock-enable signals DCKE on like-identified ports to like-identified ports on CAB 415. Command signals DCA[14:0] are forwarded via a CA relay circuit 420 as discussed above in connection with FIGS. 4A and 4B. Signal DCKE controls the power state of CAB 415, allowing controller component 505 to cause CAB to enter or exit a low-power mode. In this embodiment, CAB 415 controls a clock-enable signal BCKE to buffers 410 so that CAB and associated data buffers 410 can all enter and exit the low-power mode responsive to signal DCKE. In other embodiments subsets of data buffers 410 can be separately enabled and disabled.

A command decoder (not shown) in CAB 415 decodes commands that arrive via port DCA[14:0] from controller component 505. Such commands are well known, so a detailed treatment is omitted. A chip-select decoder 610 is included to decode chip-select signals that accompany module commands. Normally used only to select DRAM devices for access, decoder 610 also decodes chip-select signals in this embodiment to generate device clock-enable signals. This approach supports granular clock-enable functionality that allows module 400 to leave memory devices that are not the target of an access command (e.g., a read or write command) in a low-power state. In this example, chip-select decoder 610 receives full encoded chip-select information from controller component 505 and decodes this information to selectively assert a correct subset of clock-enable signals QACKE[11:0] and QBCKE[11:0]. The specific group of signals so asserted is based in part on the width configuration of the module.

Figure 6B:
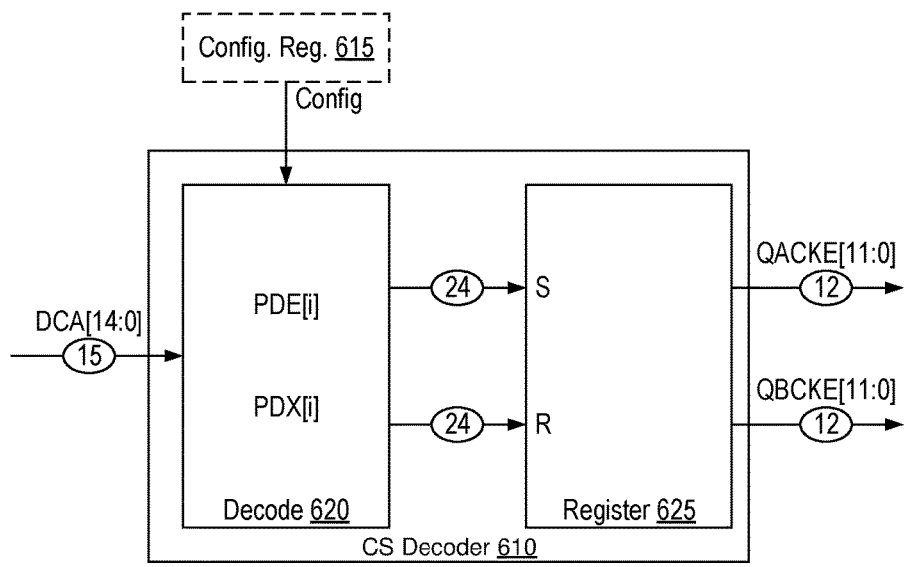
FIG. 6B depicts chip-select decoder 610 of FIG. 6A in accordance with one embodiment.

FIG. 6B depicts chip-select decoder 610 of FIG. 6A in accordance with one embodiment. A configuration register 615 stores a value indicative of the module's configuration, informing decoder 610 which data ports are active on the module in the specific configuration. In FIG. 5C, for example, all 18 data ports are active, whereas only three data ports are active for each module 400 in the configuration of FIG. 5B. Decoder 610 combines the configuration information with incoming thirty-bit commands on port DCA[14:0] to determine which of clock-enable signals QACKE[11:0] and QBCKE[11:0] to assert and which to de-assert, depending on which ranks are currently to be in self-refresh or power-down mode and which are not. Decoder 610 include decode logic 620 and a set/reset register 625. Upon detecting a power-down entry signal PDE, decode logic 620 issues a twenty-four-bit reset signal to de-assert the requisite ones of clock-enable signals QACKE[11:0] and QBCKE[11:0] to power down those of devices 600 indicated by configuration register 615. Register 625 holds that state, and thus the selected devices in the low-power mode, until decode logic 620 receives a power-down-exit command PDX and responsively resets register 625 to assert some or all of enable signals QACKE[11:0] and QBCKE[11:0]. (In this example, clock-enable signals QACKE[11:0] and QBCKE[11:0] are asserted high to enable memory devices, but whether these or other signals discussed herein are active low or active high is unimportant.)

DRAM devices 600 are DDR4 SDRAM in the embodiment of FIGS. 6A and 6B, though different types of memory devices can be used. Manufacturers of such devices publish data books detailing all aspects of their devices required for use. Data books for DDR4 memory devices describe commands formatted specifically for DDR4 devices. Such commands are conveyed from CAB 415 to devices 600 via secondary bus 425L (and 425R of FIGS. 4A and 4B). Each device 600 is only receptive to commands if its respective chip-select signals (e.g., QACS[i]) is asserted. CAB 415 interprets commands from controller component 505 via primary bus DCA[14:0] to select from among the DRAM commands and to determine to which devices 600 those commands apply. In the case of the DDR4 devices 600 in this example, the following commands direct device behavior:

TABLE 1

| DDR4 Memory Commands | |
|---|---|
| Mode Register Set | MRS |
| Refresh | REF |
| Self Refresh Entry | SRE |
| Self Refresh Exit | SRX |
| Single Bank Precharge | PRE |
| Precharge all Banks | PREA |
| Reserved for Future Use | RFU |
| Bank Activate | ACT |
| Write (Fixed BL8 or BC4) | WR |
| Write (BC4, on the Fly) | WRS4 |
| Write (BL8, on the Fly) | WRS8 |
| Write with Auto Precharge (Fixed BL8 or BC4) | WRA |

TABLE 1-continued

DDR4 Memory Commands

| | |
|---|---|
| Write with Auto Precharge (BC4, on the Fly) | WRAS4 |
| Write with Auto Precharge (BL8, on the Fly) | WRAS8 |
| Read (Fixed BL8 or BC4) | RD |
| Read (BC4, on the Fly) | RDS4 |
| Read (BL8, on the Fly) | RDS8 |
| Read with Auto Precharge (Fixed BL8 or BC4) | RDA |
| Read with Auto Precharge (BC4, on the Fly) | RDAS4 |
| Read with Auto Precharge (BL8, on the Fly) | RDAS8 |
| No Operation | NOP |
| Device Deselected | DES |
| Power Down Entry | PDE |
| Power Down Exit | PDX |
| ZQ calibration Long | ZQCL |
| ZQ calibration Short | ZQCS |

Data books are publically available, and their use in creating systems that incorporate memory devices is well understood by those of skill in the art. Details about signaling schemes and command sets are therefore omitted here to the extent they are not related to power-state control functionality that improves power-state granularity for improved system efficiency.

Four of the above-listed DDR4 memory commands are of interest here: Power-Down Entry (PDE), Power-Down Exit (PDX), Self-Refresh Entry (SRE), and Self-Refresh Exit (SRX). Their format is detailed in the following table, in which L stands for the signal value "low," H for "high," X for "don't care," and V for "Valid" (e.g., a valid address). These commands can be accompanied by a parity bit (not shown).

TABLE 2

DDR4 Modified Commands

| | CKE | | | | RASn/ | CASn/ | Wen/ | | | | A12/ | A17, A13, | A10/ | |
|---|---|---|---|---|---|---|---|---|---|---|---|---|---|---|
| Abbr | P | C | CSn | ACTn | A16 | A15 | A14 | BG [1:0] | BA [1:0] | C2-C0 | BCn | A11 | AP | A0-A9 |
| SRE | H | L | L | H | L | L | H | V | V | V | V | V | V | V |
| SRX | L | H | H | X | X | X | X | X | X | X | X | X | X | X |
| | | | L | H | H | H | H | V | V | V | V | V | V | V |
| | | | | | | | | • | | | | | | |
| | | | | | | | | • | | | | | | |
| | | | | | | | | • | | | | | | |
| PDE | H | L | H | X | X | X | X | X | X | X | X | X | X | X |
| PDX | L | H | H | X | X | X | X | X | X | X | X | X | X | X |

The columns identifying the command bits are:

TABLE 3

Command Fields

| | |
|---|---|
| CKE | Clock Enable, with P and C for Previous and Current clock cycle |
| CSn | Chip Select ("n" for active low) |
| ACTn | Activate |
| RASn/A16 | Row Access Strobe/Address bit 16 |
| CASn/A15 | Column Access Strobe/Address bit 15 |
| WEn/A14 | Write Enable/Address bit 14 |
| BG[1:0] | Bank Group |
| BA[1:0] | Bank Address |
| C2-C0 | Encoded chip-select signals for 3D stacked DRAMS |
| A12/BCn | Address bit 12/Burst Chop |
| A17, A13, A11 | Address bits 17, 13, and 11 |
| A10/AP | Address bit 10/Autoprecharge |
| A0-A9 | Address bits 9:0 |

Commands PDE and PDX are available to cause a device 600 to enter and exit a power-down mode in which the device does not self-refresh, and therefore does not maintain stored data. These signals normally control the assertion and de-assertion of clock-enable signals, but are not used in the embodiment of FIGS. 6A and 6B. Instead, commands SRE and SRX are modified to support their original respective functions and to replace commands PDE and PDX for controlling each DRAM device 600.

Considering Self-Refresh Entry SRE first, if a command from controller component 505 requires some set of devices 600 to be placed into a low-power self-refresh mode, decoder 610 issues command SRE with bit A12/BCn low L. CAB 415 identifies which devices are the target of the command by decoding chip-select signals from controller component 505, a process detailed below. Command SRX is similarly extended to support command PDX, which removes devices 600 from the self-refresh mode if bit A12/BCn is low, or from the power-down mode if bit A12/BCn is high. Because clock-enable signals are decoded from chip-select signals, command bits CKE P and CKE C are not required for SRE, SRX, or any of the other supported device commands.

Figure 7A:
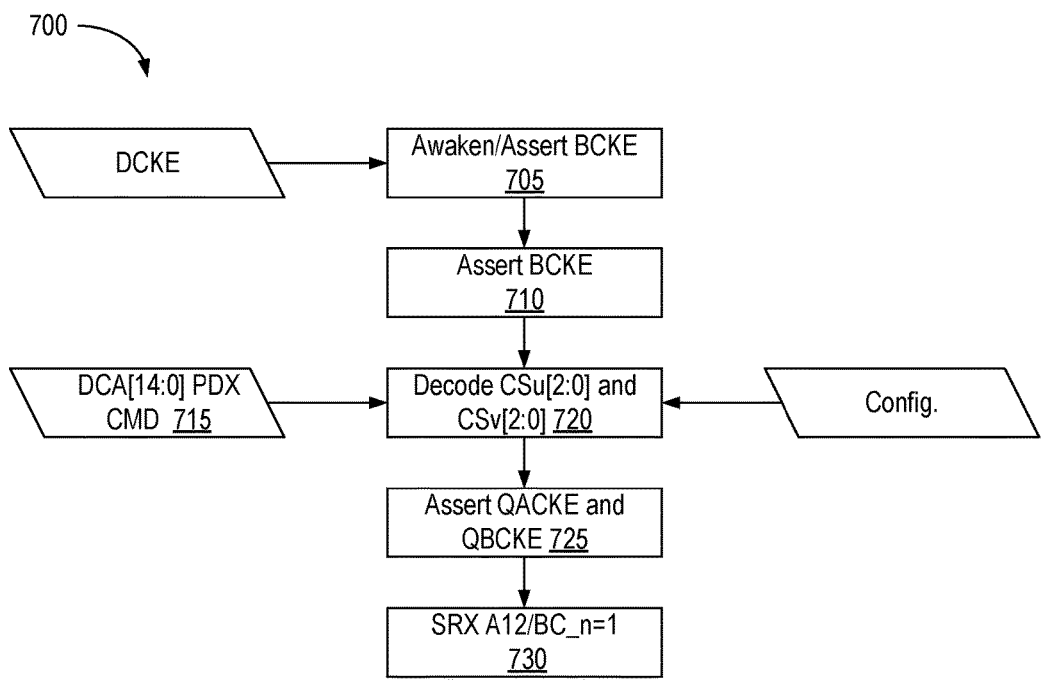
FIG. 7A is a flowchart 700 illustrating how decoder 610 of FIGS. 6A and 6B decodes commands on primary channel DCA[14:0] to support more granular clock-enable functionality, and concomitant power-state granularity and system efficiency.

FIG. 7A is a flowchart 700 illustrating how decoder 610 of FIGS. 6A and 6B decodes commands on primary channel DCA[14:0] to support more granular clock-enable functionality, and concomitant power-state granularity and system efficiency. This example relates to a memory transaction (e.g., read or write) directed to as few as three and as many as eighteen of the seventy-two devices 600 on a module 400 in which CAB 415, buffers 410, and devices 600 are all in low-power states.

To begin, controller component 505 asserts clock-enable signal DCKE. CAB 415 responsively awakens from the low-power state (705) and asserts signal BCKE (710) to awaken buffers 410. Controller component 505 conveys a thirty-bit power-down exit PDX command 715 on bus DCA[14:0] over two successive clock cycles. Command 715 includes eighteen command bits DC[17:0], two bank-group bits BG[1:0], two bank-address bits BA[1:0], six chip-select bits CSu[2:0] and CSv[2:0], an activate bit ACT, and a parity bit PAR. Decode logic 620 can retime the two fifteen-bit portions into a half-rate thirty-bit command for use inside CAB 415.

Decode logic 620 decodes chip-select bits CSu[2:0] and CSv[2:0] and combines this information with configuration signal Config to identify the subset of devices 600 that are the target of a subsequent activate command (720). Decoder 610 asserts whichever of clock-enable signals QACKE[11:0] and QBCKE[11:0] are required to awaken the target devices 600 (725). Register 625 holds these values until reset by a subsequent command SRE or PDE command.

CAB 415 can reset register 625 when devices 600 are not in use (e.g., after some delay since the last access). In such cases, controller 505 tracks that delay to know when to issue a PDX command before a subsequent access. Controller 505 could do this by retaining a copy of register bits 625 and including or referencing delay counters.

CAB 415 issues a power-down exit (PDX) command on secondary bus 425L using the SRX format noted above and setting bit A12/BC_n to a logic 1 (730). Module 400 is thus prepared to receive a subsequent activate command from controller component 505. The activate command follows the same command format at command 715, including the six chip-select bits CSu[2:0] and CSv[2:0]. CAB 415 decodes these chip-select bits to assert whichever of the device chip-select signals QACS[11:0] and QBCS[11:0] are needed to complete the memory transaction.

Figure 7B:
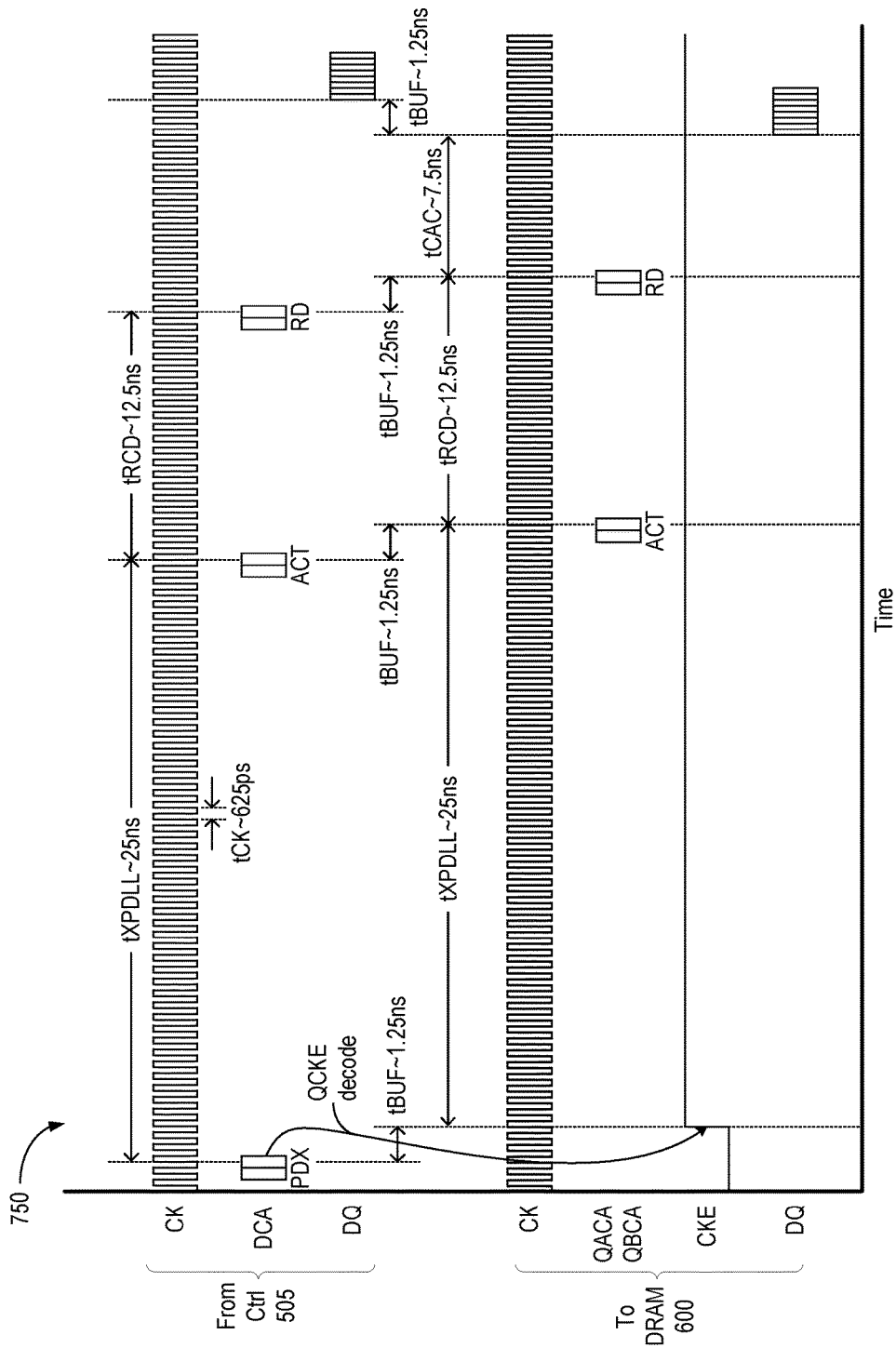
FIG. 7B is a waveform diagram 750 showing the timing associated with the process of FIG. 7A.

FIG. 7B is a timing diagram 750 showing the timing associated with the process of FIG. 7A. CAB 415 converts a PDX command from controller component 505 into an assertion of clock-enable signals to DRAM devices 600. The clock-enable signals are asserted a time tXPDLL before an activate command ACT.

Chip-select decoder 610 is part of CAB 415 in this example, but all or part of the command-decoding logic can be placed elsewhere. In other embodiments, for example, data buffers otherwise like DQ buffers 410 control the chip-select and/or clock-enable signals to each device 600 responsive to signals from CAB 415.

Figure 8A:
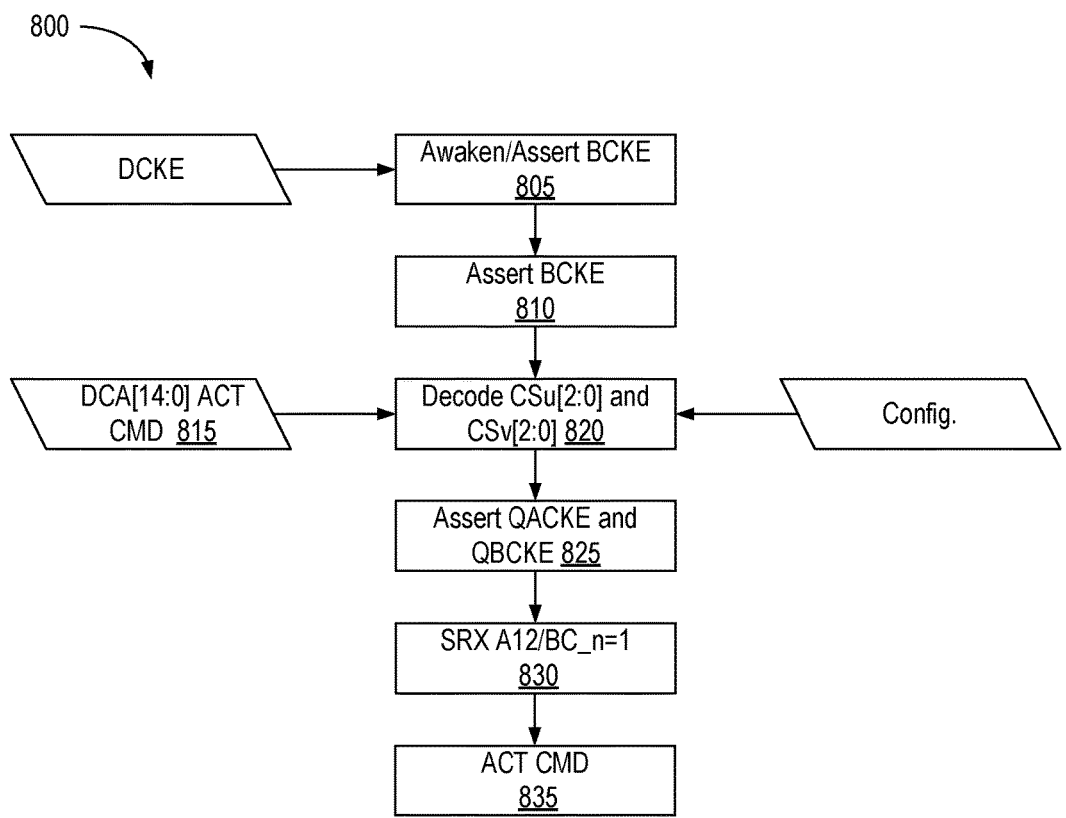
FIG. 8A is a flowchart 800 illustrating how decoder 610 of FIGS. 6A and 6B decodes commands on primary channel DCA[14:0] to support more granular clock-enable functionality, and concomitant power efficiency, in accordance with another embodiment.

FIG. 8A is a flowchart 800 illustrating how decoder 610 of FIGS. 6A and 6B decodes commands on primary channel DCA[14:0] to support more granular clock-enable functionality, and concomitant power efficiency, in accordance with another embodiment. As in the example of FIGS. 7A and 7B, this example relates to a memory transaction directed to as few as three and as many as eighteen of the seventy-two devices 600 on a module 400.

To begin, controller component 505 asserts clock-enable signal DCKE. CAB 415 responsively awakens from the low-power state (805) and asserts signal BCKE (810) to awaken buffers 410. Controller component 505 then conveys a thirty-bit activate command ACT 815 on bus DCA[14:0] over two successive clock cycles. Command 815 includes eighteen command bits DC[17:0], two bank-group bits BG[1:0], two bank-address bits BA[1:0], six chip-select bits CSu[2:0] and CSv[2:0], an activate bit ACT, and a parity bit PAR. Decode logic 620 can retime the two fifteen-bit portions into a half-rate thirty-bit command for use inside CAB 415. Decode logic 620 decodes the chip-select bits CSu[2:0] and CSv[2:0] of command 815 and combines this information with configuration signal Config to identify the subset of devices 600 that are the target of the activate command (820). Decoder 610 then asserts whichever of clock-enable signals QACKE[11:0] and QBCKE[11:0] are required to awaken the target devices 600 (825). These values are used to set, and are thus stored within, register 625. CAB 415 issues a power-down exit command PDX on secondary bus 425L using the SRX format noted above and setting bit A12/BC_n to a logic 1 (830). With the clock-enabled devices 600 thus prepared, CAB 415 issues an activate command ACT on secondary bus 425L (835) while asserting whichever of the device chip-select signals QACS[11:0] and QBCS[11:0] are needed to complete the memory transaction. Device chip-selection is based on the same device chip-select bits CSu[2:0] and CSv[2:0] of command 815 used for clock enable.

Figure 8B:
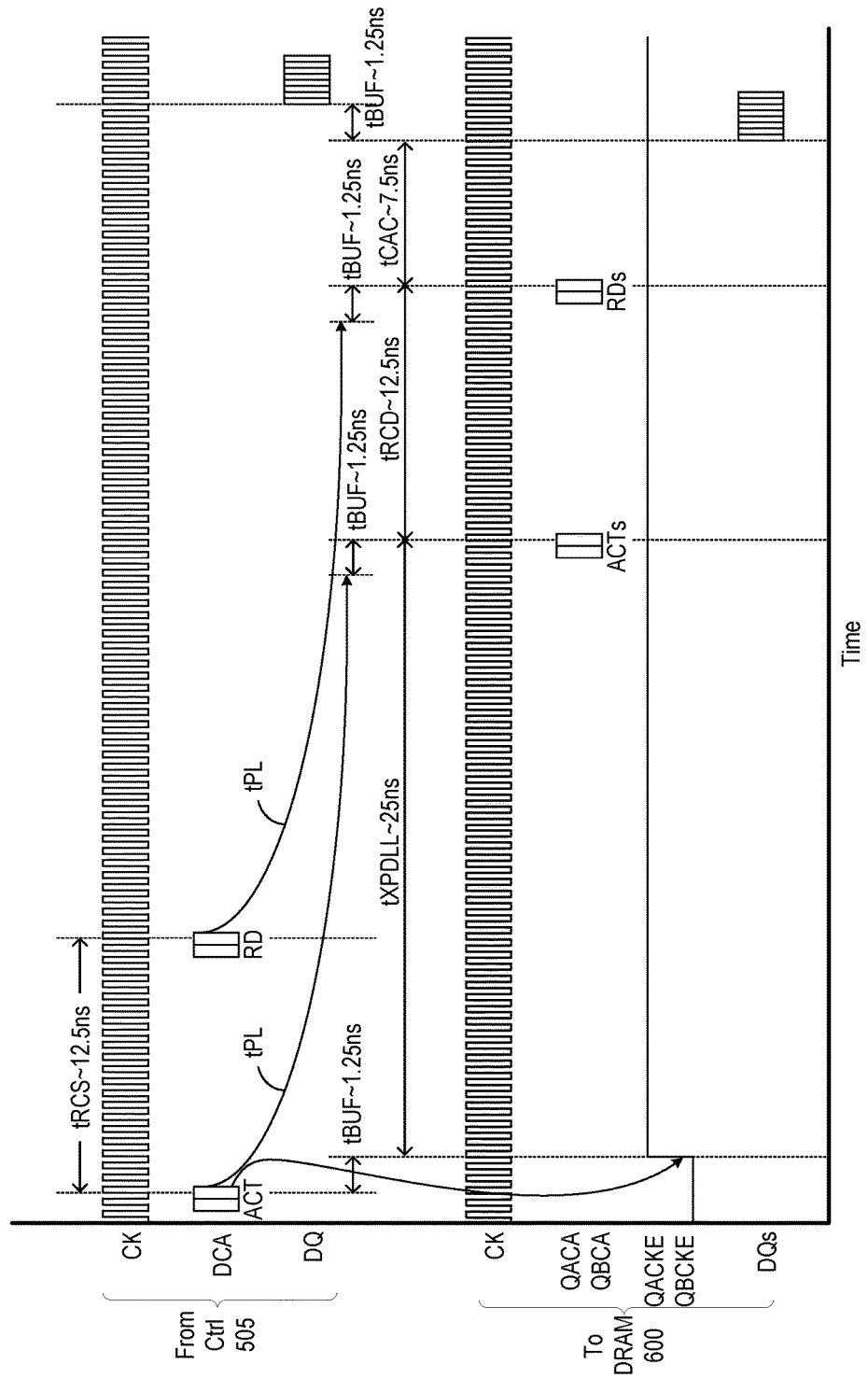
FIG. 8B is a waveform diagram 850 showing the timing associated with the process of FIG. 8A.

FIG. 8B is a timing diagram 850 showing the timing associated with the process of FIG. 8A. The activate command 815 issued by controller component 505 is decoded by CAB 415 and clock signals QACKE/QBCKE are asserted after a delay tBUF. Controller component 505 then issues a read command RD after a delay tRCS. In this embodiment, CAB 415 uses an internal pipeline—not shown—to delay all commands by time tXPDLL regardless of whether a rank is powered up or down. For example, CAB 415 asserts an activate command ACTs on the secondary bus to DRAM devices 600 after a time tXPDLL from the primary activate command ACT, and issues a read command RDs on the secondary bus after the same delay. DRAM devices convey data DQs to CAB 415 after a delay tCAC from the secondary read command, and CAB 415 sends that data on to controller component 505 after a buffer delay tBUF. As with the embodiment of FIGS. 7A and 7B, all or part of the command-decoding logic can be placed outside of CAB 415.

Figure 9:
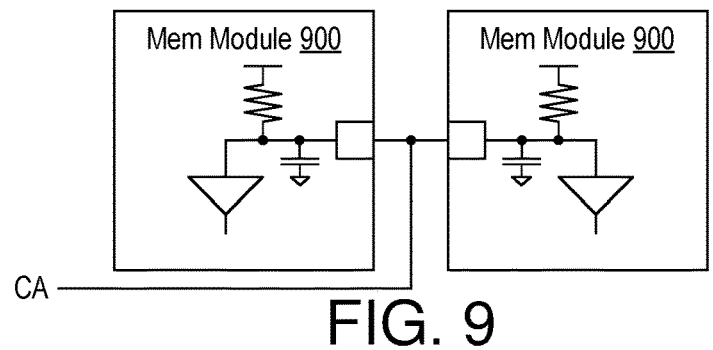
FIG. 9 depicts a memory system in which a single command link CA communicates command and address signals simultaneously to two buffered modules 900.

FIG. 9 depicts a memory system in which a single command link CA communicates command and address signals simultaneously to two buffered modules 900. This type of connection, termed a "point-to-two-point" connection, does not support the highest speed performance available from a point-to-point connection, but can be used without introducing latency in the manner of the embodiments detailed above.

Figure 10:
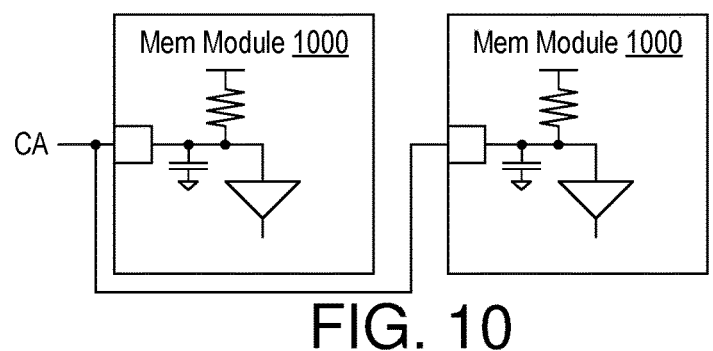
FIG. 10 depicts a memory system in which a single command link CA communicates command and address signals simultaneously to two buffered modules 1000.

FIG. 10 depicts a memory system in which a single command link CA communicates command and address signals simultaneously to two buffered modules 1000. This type of connection, termed a "fly-by" connection, also tends to be slower than a point-to-point connection, but can be used without introducing additional latency.

Figure 11:
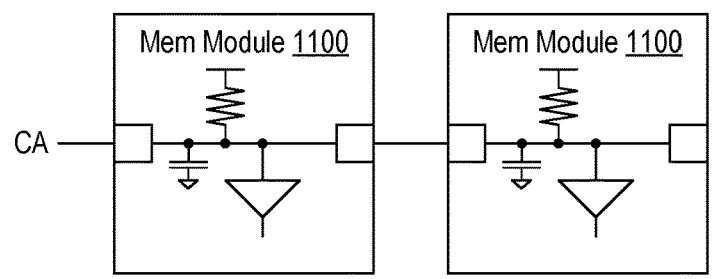
FIG. 11 depicts a memory system in which a single command link CA communicates command and address signals simultaneously to two buffered modules 1100.

FIG. 11 depicts a memory system in which a single command link CA communicates command and address signals simultaneously to two buffered modules 1100. This connectivity is similar to that of FIG. 10, but the CA connectivity is provided to the second module 1100 via the first module 1100. Similar to FIG. 10, it can also be used without introducing additional latency.

Figure 12:
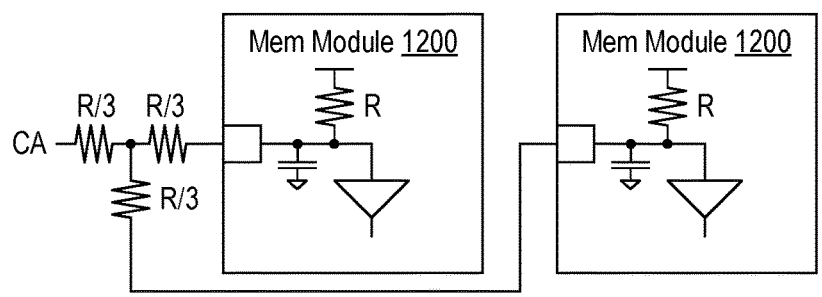
FIG. 12 depicts a memory system in which a single command link CA communicates command and address signals simultaneously to two buffered modules 1200.

FIG. 12 depicts a memory system in which a single command link CA communicates command and address signals simultaneously to two buffered modules 1200. This connection uses a power splitter with three resistors, each of a value one-third that of a termination resistance R on each module 1200. As in the examples of FIGS. 9, 10, and 11, this connectivity tends to be slower than point-to-point but does not require latency be inserted into the command path.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Similarly, signals described or depicted as having active-high or active-low logic levels may have opposite logic levels in alternative embodiments.

With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While memory systems have been described in connection with specific embodiments, variations of these embodiments are also envisioned. These examples are in no way exhaustive, as many alternatives within the scope of the claims will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. For U.S. applications, only those claims specifically reciting "means for" or "step for" should be construed in the manner required under the sixth paragraph of 35 U.S.C. § 112.

What is claimed is:

1. A memory module comprising:
 a command input port to receive a module read command;
 a command relay circuit coupled to the command input port to receive the module read command, the command relay circuit to issue a delayed version of the module read command from the memory module responsive to the module read command;
 command logic coupled to the command input port to receive the module read command and issue a memory-device read command responsive to the module read command, the command logic including a selectable delay element to selectively impose a read-command delay on the memory-device read command;
 memory devices each having a command port coupled to the command logic to receive the memory-device read command; and
 a register to store a configuration value controlling the command relay circuit and the selectable delay element.

2. The memory module of claim 1, wherein the configuration value alternatively:
 powers the command relay circuit and selects a first delay through the selectable delay element; or
 disables the command relay circuit and selects a second delay longer than the first delay through the selectable delay element.

3. The memory module of claim 2, wherein the delayed version of the module read command is delayed by the second delay relative to the module read command.

4. The memory module of claim 3, further comprising a clock input port to receive a clock signal having a clock period equal, wherein the second delay is the clock period.

5. The memory module of claim 1, further comprising:
 module data pads; and
 a data buffer having memory-device data ports coupled to the memory devices to receive read data provided by the memory devices responsive to the memory-device read command and convey at least a portion of the read data to at least one of the module data pads.

6. The memory module of claim 5, the data buffer to direct the read data to the module data pads responsive to the configuration value.

7. The memory module of claim 5, wherein the data buffer is one of a plurality of buffers that convey the read data to the module data pads.

8. The memory module of claim 1, wherein the memory devices are DRAM devices.

9. A method for reading data from a rank of memory devices, the rank of memory devices including a first sub-rank of memory devices on a first memory module and a second rank of memory devices on a second memory module, the method comprising:
 receiving a rank read command at the first memory module;
 relaying a delayed version of the rank read command to the second memory module, the delayed version of the rank read command delayed relative to the rank read command by a read-command delay;
 issuing a first sub-rank read command responsive to the rank read command to the first sub-rank of memory devices on the first memory module;
 issuing a second sub-rank read command time aligned with the first sub-rank read command responsive to the delayed version of the rank read command to the second sub-rank of memory devices on the second memory module; and
 conveying a first portion of the read data from the first sub-rank of memory devices on the first memory module responsive to the first sub-rank read command and a second portion of the read data from the second sub-rank of memory devices on the second memory module responsive to the second sub-rank read command.

10. The method of claim 9, wherein the conveying of the first portion of the read data from the first sub-rank of memory devices and the second portion of the read data from the second sub-rank of memory devices occur simultaneously.

11. The method of claim 9, further comprising decoding rank chip-select signals from the rank read command.

12. The method of claim 11, further comprising developing device chip-select signals from the decoded rank chip-select signals and simultaneously asserting the device chip-select signals to the first sub-rank of memory devices on the first memory module and the second sub-rank of memory devices on the second memory module.

13. The method of claim 9, further comprising timing the conveying of the first portion of the read data from the first sub-rank of memory devices and the second portion of the read data from the second sub-rank of memory devices to a clock signal, the clock signal of a clock period equal to the read-command delay.

14. The method of claim 9, further comprising loading a register on the first memory module prior to receiving the rank read command, the register loaded with a first configuration value enabling the relaying of the delayed version of the read command.

15. The method of claim 14, wherein the first sub-rank read command is delayed responsive to the first configuration value.

16. The method of claim 15, further comprising loading a second register on the second memory module, the second register loaded with a second configuration value different from the first configuration value while the first register is loaded with the first configuration value.

17. The method of claim 16, wherein the second configuration value aligns the second sub-rank read command with the delayed sub-rank read command.

18. The method of claim 14, the first configuration value assigning a number of memory devices in the first sub-rank of the memory devices.

19. The method of claim 14, further comprising steering the first portion of the read data to alternative data pads on the first memory module responsive to the first configuration value.

20. The method of claim 19, further comprising loading a second register on the second memory module prior to receiving the rank read command, the second register loaded with a second configuration value different from the first configuration value, and steering the second portion of the read data to alternative pads on the second memory module responsive to the second configuration value.

* * * * *